(12) United States Patent
Boerner

(10) Patent No.: US 8,536,779 B2
(45) Date of Patent: Sep. 17, 2013

(54) ELECTROLUMINESCENT DEVICE WITH PROTECTIVE MEANS FOR DIVIDE AREAS

(75) Inventor: Herbert F. Boerner, Aachen (DE)

(73) Assignee: Koinklijke Philips N.V., Eindhoven (NL)

( * ) Notice: Subject to any disclaimer, the term of this patent is extended or adjusted under 35 U.S.C. 154(b) by 0 days.

(21) Appl. No.: 13/146,931

(22) PCT Filed: Jan. 27, 2010

(86) PCT No.: PCT/IB2010/050368
§ 371 (c)(1),
(2), (4) Date: Jul. 29, 2011

(87) PCT Pub. No.: WO2010/089681
PCT Pub. Date: Aug. 12, 2010

(65) Prior Publication Data
US 2011/0285277 A1    Nov. 24, 2011

(30) Foreign Application Priority Data
Feb. 5, 2009 (EP) .................................... 09152172

(51) Int. Cl.
*H05B 33/00* (2006.01)
*H01J 9/00* (2006.01)
*H01L 51/52* (2006.01)

(52) U.S. Cl.
USPC ................ 313/504; 313/506; 445/24; 445/25

(58) Field of Classification Search
USPC .................................................. 313/504–506
See application file for complete search history.

(56) References Cited

U.S. PATENT DOCUMENTS

| | | | |
|---|---|---|---|
| 5,587,589 A * | 12/1996 | So et al. ........................... | 257/40 |
| 5,814,417 A * | 9/1998 | Nagayama .................... | 428/690 |
| 6,087,196 A | 7/2000 | Sturm et al. | |
| 2003/0017777 A1* | 1/2003 | Matsuoka et al. .............. | 445/24 |
| 2003/0156080 A1* | 8/2003 | Koike et al. ..................... | 345/60 |
| 2005/0142974 A1 | 6/2005 | Lee | |
| 2008/0030132 A1* | 2/2008 | Adachi et al. ................. | 313/506 |
| 2008/0231180 A1* | 9/2008 | Waffenschmidt et al. .... | 313/506 |
| 2008/0259987 A1* | 10/2008 | Smith ............................ | 372/80 |
| 2009/0224664 A1* | 9/2009 | Yoshida et al. ............... | 313/504 |
| 2010/0109513 A1* | 5/2010 | Eser et al. ..................... | 313/504 |
| 2010/0176385 A1* | 7/2010 | Lifka et al. ..................... | 257/40 |

FOREIGN PATENT DOCUMENTS

| | | |
|---|---|---|
| EP | 0758192 A2 | 2/1997 |
| GB | 2352086 A | 1/2001 |
| WO | 03096751 A1 | 11/2003 |

* cited by examiner

*Primary Examiner* — Sikha Roy
(74) *Attorney, Agent, or Firm* — David Zivan; Mark Beloborodov

(57) ABSTRACT

The invention discloses an electroluminescent device (10), comprising a substrate (40) and on top of the substrate (40) a substrate electrode (20), a counter electrode (30) and an electroluminescent layer stack with at least one organic electroluminescent layer (50) arranged between the substrate electrode (20) and the counter electrode (30), and an encapsulation means (90) at least encapsulates the electroluminescent layer stack, at least one divide (80,80') dividing at least the counter electrode (30) into a plurality of electrically separated counter-electrode-segments (110,110',110"), below the divide (80,80') an electrically non-conductive protective means (70) is arranged on the substrate electrode (20) exceeding the divide (80, 80') and the protective means (70) is arranged on the substrate electrode (20) with a shape suitable to prevent the emergence of a shadowing edge.

12 Claims, 12 Drawing Sheets

ELECTROLUMINESCENT DEVICE WITH PROTECTIVE MEANS FOR DIVIDE AREAS

FIELD OF THE INVENTION

This invention relates to an electroluminescent device with at least one divide dividing the counter electrode into a plurality of electrically separated segments. Furthermore, the invention relates to a method for segmentation of the counter electrode, the use of protective means to divide the counter electrode, the use of conductive glue to contact the counter electrode segments, the corresponding protection means and substrate covered with the substrate electrode according to the present invention.

BACKGROUND OF THE INVENTION

US 2005/142 974 A1 describes an electroluminescent display and a method for fabrication of an electroluminescent display. To produce this electroluminescent display a first electrode is formed on a substrate. Then, an insulating layer is formed on the first electrode at boundaries of pixel regions. Onto the said insulating layer preformed separators with a predetermined inverted taper shape are applied. An organic electroluminescent layer is dispersed on the substrate. The separators divide the organic electroluminescent layer into separated segments. Because the separators are located at the boundaries of the pixel regions, color mixing, which may be caused by an overflow of the organic electroluminescent layer can be prevented between neighboring pixel regions. In a further step, a second electrode material layer is formed on the entire surface of the organic electroluminescent layer and the separators. In a last step a laser is used to irradiate a portion of the second electrode layer corresponding to the separators. Therefore, the irradiated portion of the second electrode layer is removed. Thus, an electroluminescent device divided into a plurality of electrically separated segments is achieved, each segment comprising an organic electroluminescent layer and a counter electrode. Unfortunately, the application of the separators is complicated and costly.

SUMMARY OF THE INVENTION

Thus, the invention has for its object to eliminate the above mentioned disadvantages. In particular, it is an object of the invention to provide an segmented electroluminescent device allowing a flexible and easy production and a reliable operation.

This object is achieved by an electroluminescent device as taught by claim 1 of the present invention. Also the object is achieved by a method as taught by claim 8 of the present invention. Advantageous embodiments of the electroluminescent device and the method are defined in the sub claims. Features and details described with respect to the electroluminescent device also apply to the method and vice versa.

This invention discloses an electroluminescent device, comprising a substrate and on top of the substrate a substrate electrode, a counter electrode and an electroluminescent layer stack with at least one organic electroluminescent layer arranged between the substrate electrode and the counter electrode, and an encapsulation means at least encapsulating the electroluminescent layer stack, at least one divide dividing at least the counter electrode into a plurality of electrically separated counter-electrode-segments, and below the divide an electrically non-conductive protective means arranged on the substrate electrode exceeding the divide with a shape suitable to prevent the emergence of a shadowing edge.

The leading idea of the present invention is to use a protective means, which is applied to the substrate electrode and to insert the divide at least into the counter electrode above the protective means. In the context of the invention the notation divide denotes any gaps between initially connected layers created after depositing such layers in contrast to lithographic and/or mask processes leading to structured layers. The divide may comprise a trench-like shape separating the formerly uniform counter electrode in at least two electrically separated counter-electrode-segments—also referred to as segments. Furthermore, the non-conductive protective means ensures that no direct contact between the two electrodes occurs, which would lead to a short. There is no more need of the salient separators. The use of a protective means is sufficient, as the separation of the counter electrode can be done mechanically. The structuring of the counter electrode is done above the protective means, which is used to protect the substrate electrode from any impacts of the application of the divide into the counter electrode. The disclosed structuring of the electroluminescent device can for example be applied in a glove box under inert and/or dry atmosphere, e.g. dry nitrogen etc. Therefore, the production of the disclosed electroluminescent device is far cheaper than the known prior art. Furthermore the substrate area covered by the protection means can be adjusted individually for each electroluminescent device allowing a variable segmentation of individual electroluminescent devices along the protection means.

In the context of the invention the notion electroluminescent (EL) layer stack denotes all layer prepared between the substrate electrode and the counter electrode. The EL layer stack comprises at least one light emitting organic electroluminescent layer prepared between substrate and counter electrode. In other embodiments the electroluminescent layer stacks may comprise several layers prepared between substrate and counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and or the counter electrode comprise at least one of the following materials: ITO, aluminum, silver, doped ZnO, or an oxide layer.

In the context of the invention the notion substrate denotes a base material onto which the different layers of an electroluminescent device are deposited. Normally, the substrate is transparent and is made of glass. Furthermore, it may be preferable that the substrate is transparent, preferably comprising at least one of the following materials: silver, gold, glasses or ceramics. It may also be a transparent polymer sheets or foils with a suitable moisture and oxygen barrier to essentially prevent moisture and/or oxygen entering the electroluminescent device layer stack. It is also possible to use non-transparent materials like metal foils as substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers (8-15 nm thick) are used single or in combination with ITO as the substrate electrode. If a metal foil is used as the substrate, it takes also the role of the substrate electrode, either anode or cathode. The notation on-top-of denoted the sequence of the listed layers. This notation explicitly comprises the possibility of further layers in between the layer denoted as on top of each other. For example, there might be additional optical layers to enhance the light out-coupling arranged between substrate electrode and substrate.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers.

In the context of the invention an electroluminescent device with a combination of a transparent substrate, a transparent substrate electrode and a non-transparent counter electrode (usually reflective), emitting the light through the substrate is called "bottom-emitting". In case of electroluminescent device comprising further electrodes, in certain embodiments both substrate and counter electrodes could be either both anodes or both cathodes, when the inner electrodes as driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting. In the context of the invention a layer, substrate or electrode is called transparent if the transmission of light in the visible range is more than 50%; the rest being absorbed or reflected. Furthermore, in the context of the invention a layer, substrate or electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, connector or construction element of an electroluminescent device is called electrically conducting if its electrical resistance is less than 100000 Ohm. In the context of the invention passive electronic components comprise resistors, capacitors and inductivities. Furthermore, in the context of the invention active electronic components comprise diodes, transistors and all types of integrated circuits.

In the context of the invention a layer, substrate, electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, substrate, electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

The shape of a cross-section of the divide depends on the one hand on the tool used to insert the divide into the counter electrode and on the other hand on the material properties of the counter electrode. The only aim, which has to be achieved by the divide, is the electrical separation of the counter electrode segments. To achieve this aim, the divide may have a "V", "W", "Y" or "U"-shape. Furthermore, the divide may possess any cross-section, which is useful to achieve the named aim and which can be easily inserted into the counter electrode of the electroluminescent device.

In the claimed invention, the electrically non-conductive protective means is arranged below the divide on the substrate electrode exceeding the divide. The notation that the protective means is arranged below and exceeding the divide denotes on the one hand, that the protective means is fully below the area, where the divide is inserted into the counter electrode. Furthermore, it denotes that the width covered by the protective means (a protective width) exceeds the width of the divide (a divide width). So the protective means is at least fully covering the area below the divide.

The protective means protects the substrate electrode from the divide. Furthermore, this protective means is used for the structuring of the electroluminescent device, as the divide is arranged above the protective means. The protective means prevents shorts between the two electrodes of the electroluminescent device. The protective means must comprise material properties that ensure that the divide and/or the application of the divide does not lead to a direct contact between the two electrodes. Therefore, the protective means may be hard and/or thick enough to protect the substrate electrode from mechanical means like a scalpel, which is used to cut the counter electrode to achieve the electrically separated counter-electrode-segments. For example, cutting the counter electrode with e.g. a scalpel without any protective means underneath the divide commonly leads to shorts at least reducing the lifetime of the electroluminescent devices.

In a preferred embodiment the protective means comprises non-conductive glue. Non-conductive glue has the advantage, that it is easy to apply and will not damage the substrate electrode. Furthermore, it can be applied in air and there is no need to use a vacuum chamber or a clean room. Therefore, non-conductive glue can easily be applied to the substrate electrode and—after hardening—prevent as a protective means any short between the two electrodes.

To achieve lasting non-conductive glue at least one of the following matrices may be used: epoxys, polyurethanes, acrylic or silicone.

Oxygen or water may damage the organic electroluminescent layer or the counter electrode. As the protective means may have direct contact with the organic electroluminescent layer, it is preferred, that the non-conductive glue of the protective means is anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the non-conductive glue itself but also on the amount of water, which can be absorbed by the organic electroluminescent layer without damaging it.

In a further preferred embodiment the electroluminescent device may comprise moisture and/or oxygen barriers. In the context of the invention layers prevention harmful diffusion of moisture and/or oxygen into the layer stack are called moisture and/or oxygen barriers. A diffusion is denoted as harmful if a significant life-time reduction of the emitted light can be observed. Standard OLED devices according to state of the art achieve shelf life times in the order of 100000 hours or more. A significant reduction denotes a reduced life-time of about a factor of 2 or more.

In another preferred embodiment the protective means may comprise at least one of the following: a photo resist, a lacquer, paint or a layer of glass, made of re-melted glass frit or an oxidized metal layer, preferably anodized Aluminum. The protective means has to prevent the direct contact between the counter electrode and the substrate electrode, which would lead to a short. The named materials can easily be applied to the substrate electrode, often without the need of a clean room or a vacuum chamber. Therefore, the application of the protective means can be done easily and economically.

The protective means must have properties that on the one hand ensure that it is electrically not conductive. Furthermore, it must be thick and/or hard enough to shield the substrate electrode from the contact means. The precise thickness and hardness depend on the actual pressure exerted during the inserting of the divide and/or by the contact means, but typically 1-100 micrometer thickness are sufficient. The desired protection has been achieved with photoresist layers of 1.5 micrometer thickness as well as with layers of non-conductive glue of 10-200 micrometer thickness, but thicker layers can also be used. Furthermore, it must be ensured that the protective means does neither damage the substrate electrode, the organic electroluminescent layer, the counter electrode and/or the counter electrode segments.

In another preferred embodiment the protective means is dyed. This may be done by coloring the protective means itself or by applying colored pigments to the protective means.

In a preferred embodiment a path of the protective means on top of the substrate electrode forms a closed track. If the divide is applied above the protective means—and thereby also forms a closed track—the counter electrode is divided into an inner segment and an outer segment. The inner segment is encircled by the closed track of the divide and the underlying protective means. The outer segment may encircle this inner segment. Each of the two named segments can individually be driven by the usage of at least one contact means for each of the segments. The protective means and/or the divide may comprise a shape of a circle, oval or any needed structure. By using a protective means, which forms a closed track the protective means and the divide, may form the outer boundaries of letters or individual pixels for a display, any characteristic shapes, signs etc. People skilled in the art may choose other shapes of the closed track within the scope of this invention.

In another embodiment, the protective means may form a non-closed track where both ends of the non-closed track extend over the outer edges of the electroluminescent layer stack and the counter electrode. In this case, in alternative embodiments the substrate electrode and the counter electrode of each separated counter electrode segments may be connected to a power source via structured electrode layers on top of the substrate. The non-closed track of the protection means may form a straight line, a curved line or a line with any other shape within the scope of this invention suitable to provide separate counter electrodes not in contact with the substrate electrode after applying the divide.

In a further preferred embodiment the electroluminescent device comprises at least one contact means, for electrically contacting at least one counter-electrode-segment of the counter electrode to an electrical source. The contact means works as a bridge to transfer the electrical current from the electrical source to the counter electrode and/or the counter-electrode-segment of the electroluminescent device. Often the substrate electrode is connected at the rim of the substrate to an electrical source. For individually connecting the counter-electrode-segment of the electroluminescent device to an electrical source it is preferred to arrange the contact means on the counter electrode segment connected to the cover lid. It is preferred, that the contact means comprises conductive glue and/or a conductive lacquer and/or conductive paint.

Furthermore, it is preferably that the contact means is arranged fully above the protective means. This has the advantage, that the connection of the electroluminescent device follows a three-dimensional connection schema. The contact means for each of the counter-electrode-segments is applied on top of the counter electrodes. There is no need to contact each of the counter-electrode-segments of the counter electrode at the substrate rim of the electroluminescent device. The arrangement above the protective means enables a user to use any kind of contact means. Furthermore, it is preferable to enable the application of conductive glues and/or mechanical conductive means applying mechanical stress at least to the counter electrode segments in such a way, that these contact means are arranged fully above the protective means. Even if the contact means partially and/or deliberately and/or non-deliberately penetrates the counter electrode no short will occur, as the protection means will stop any elements of the contact means getting near to the substrate electrode. Furthermore, the contact means can be connected with the encapsulation means to feed each of the segments with the needed electrical current. This can easily be done, as the encapsulation means may encapsulate not only the organic electroluminescent layer but also the layer stack. In this embodiment the preferred contact means is conductive glue and/or a mechanical contact element, establishing a mechanical contact to at least one counter-electrode-segment.

In a preferred embodiment the conductive glue comprises a matrix and filler. Preferably, the conductive glue comprises organic materials as the matrix and inorganic materials as the filler. In one embodiment, the conductive glue may comprise at least one of the following matrices: epoxies, polyurethanes or silicones. The filler and/or the matrix have to be conductive to conduct the electrical current from the electrical source to the counter electrode and/or the counter-electrode-segments. Therefore, it is preferred, that the conductive glue and/or the filler comprise conductive flakes or particles. The filler particles must possess low resistance, stability and durability. Therefore, it is preferred that the filler comprises flakes or particles of at least one: Silver, Gold, Nickel, Platinum, Copper, Palladium or other metals or other nonmetals like Carbon, glassy Carbon, Graphite, Carbon nanotubes, doped ZnO, SnO, electrically conductive nitrides, electrically conductive borides, metal covered glass or plastic beads, metal covered glass or plastic hollow beads or metal or graphite particles covered with copper, gold or silver. In a preferred embodiment the conductive glue is anhydrous and/or water free.

In a further preferred embodiment the electroluminescent device may comprise moisture and/or oxygen barriers. In the context of the invention layers prevention harmful diffusion of moisture and/or oxygen into the layer stack are called moisture and/or oxygen barriers. A diffusion is denoted as harmful if a significant life-time reduction of the emitted light can be observed. Standard OLED devices according to state of the art achieve shelf life times in the order of 100000 hours or more. A significant reduction denotes a reduced life-time of about a factor of 2 or more.

The electroluminescent device according to the invention comprises an encapsulation means to encapsulate the electroluminescent layer stack. The encapsulation means may also encapsulate the whole stack of layers of the electroluminescent device or just a plurality of layers, forming a part of the whole stack of layers. Preferably, the encapsulation means is a gas-tight element, covering at least the organic electroluminescent layer and the counter electrode. By using a gas-tight encapsulation means, it is prevented that environmental factors like water, or oxygen can damage the encapsulated layers. The encapsulation means may form a gas-tight lid. This lid may be formed of glass or metal. It is also possible to form the encapsulation means by one or a plurality of layers applied to the electroluminescent device or just parts of it. The layers may comprise silicon, silicon oxide, silicon nitride, aluminum oxide or silicon oxinitride. All the named encapsulation means prevent mechanical and/or environmental factors from affecting the layer stack of the electroluminescent device adversely.

As an example, the encapsulation means can be made of metals, glass, ceramics or combinations of these. It is attached to the substrate by conductive or non-conductive glue, melted glass frit or metal solder. Therefore, it may also provide mechanical stability for the electroluminescent device.

In a preferred embodiment, the encapsulation means is electrically connected to the contact means. The electrical connection between the contact means and the encapsulation means may be direct or indirect. In a direct manner, the encapsulation means has direct contact with the contact means. In the indirect manner, a means like a wire may be used to connect the encapsulation means and the contact means. Apart from the named wire other means may be used to connect the encapsulation means and the contact means, which are known to a person skilled in the art. It is possible to connect the electroluminescent device to an electrical source with the help of the encapsulation means. Therefore, a wire etc. may be attached to the encapsulation means, which transfers the electrical current via the contact means to the counter electrode. A requirement for this embodiment is that the encapsulation means is at least conductive in one part. To prevent shorts, the encapsulation means has then to be insulated against the substrate electrode. This may be realized in such a way that the encapsulation means is divided in two areas. One of them is an electrically conductive contact area and one is an electrically insulating area. The encapsulation means has to be designed in such a way, that the electrically conductive contact area is connected to the contact means. Using conductive glue as the contact means the advantage that during production the conductive glue can easily be applied between the counter electrode and/or the counter electrode segments and the encapsulation means. If the amount of conductive glue is too large for the gap between the counter-electrode-segments and the contact area of the encapsulation means it will flow sideways when the encapsulation means is placed on top of the substrate with the layer stack and therefore it will just cover a larger area than that of the encapsulation means. However, the amount of applied glue must be limited in order not to provide an electrical contact to the substrate electrode or the other counter electrode segments by flowing over the sides of the layer stack or into the divide.

In another preferred embodiment the encapsulation means comprises an electrically conductive gas-tight feed through. This gas-tight feed through comprises a conductive element, which is connected to the contact means. This may be done by direct contact with the contact means or by help of a wire or an element known to a person skilled in the art. If the encapsulation means is electrically conductive and connected to the substrate electrode it is preferred that the gas-tight feed through is electrically insulated against the encapsulation means. This may be done by an insulation means in which the conductive element is embedded. This insulation means for the gas-tight feed through may for example be formed by glass or ceramic, encasing the conductive element.

In another preferred embodiment the encapsulation means comprises an electrically conductive contact area. In this embodiment the encapsulation means consists of two different elements, one forming the contact area and another one forming an insulating area. Preferably, the contact area is arranged on top of the encapsulation means. Alternative, the contact area may be formed by an element embedded in the encapsulation means, wherein this embedded element is conductive. For example a metal disk may be embedded in a gas-tight multilayer structure, forming the encapsulation means. This metal disk then forms the contact area, which is in electrical contact with the contact means of the electroluminescent device. Preferably, the contact area is electrically insulated against the encapsulation means. This may be done by embedding the contact area in glass or ceramic or another material known to a person skilled in the art.

To prevent any short between the two electrodes of the disclosed electroluminescent device triggered by the contact means and/or the application of the contact means to the counter-electrode-segments the invention discloses to arrange the contact means fully above the protective means. Therefore, various contact means can be applied to the disclosed electroluminescent device without the danger of a short. To further diminish the probability of a short a plurality of contact means are disclosed within this invention, which may be used to connect the electroluminescent device, especially the counter electrode segments to an electrical source. Even if one of the named contact means is deliberately used to damage the counter electrode segments no short will occur as the protective means is arranged at least fully below the contact means.

The contact means may comprise a spring, which is placed between the encapsulation means and the counter electrode. This spring may therefore be in direct contact with the counter electrode segment and conduct electrical current from the encapsulation means to the counter electrode. The spring may be attached to the counter electrode segment, e.g. by soldering, laser welding or ultrasonic welding. The attachment process may lead to a penetration of the counter electrode and/or the electroluminescent layer stack. Again the protective means below would prevent a short. In another embodiment the spring may press a coin-like contact plate to the counter electrode. Even if the surface of this coin-like element may not be perfectly flat, but penetrates parts of the counter electrode, no short will occur as the protective means below will prevent that the surface of the contact means gets into electrical contact with the substrate electrode.

In another preferred embodiment the contact means may comprise an arc-shaped spring. The arc-like shaped spring can easily be attached to the encapsulation means and the contact between the contact means and the counter electrode is easily established. In another preferred embodiment, the contact means is a rounded tip. It may also comprise a spring, which presses the rounded tip onto the counter electrode. Due to the large area of contact between the rounded tip and the counter electrode a reliable contact is established.

To achieve a homogeneous distribution of the voltage across the area of the counter electrode it is preferred, that a plurality of contact means are applied to the counter electrode and/or the counter-electrode-segments to improve the current distribution uniformity over the counter electrode. By using a number of contact means, the achieved distribution of the voltage is more homogeneous. As the contact means may be formed by conductive glue it is easy to apply a plurality of contact means—for example drops of conductive glue—to the counter electrode. These drops of conductive glue may be in direct contact with the encapsulation means. Therefore, to connect the electroluminescent device to an electrical source it is just needed to connect the encapsulation means to the electrical source. In case of conductive encapsulation means, said means must comprise a suitable segmentation in order to keep the counter electrode segments electrically separate. The encapsulation means will most probably have a resistance, which is orders of magnitude smaller than those of the counter electrode segments. Therefore, all contact means arranged on the same counter electrode segment will be connected to the same potential. This leads to a uniform distribution of voltage and current to the organic electroluminescent layer and in a homogeneous generation of artificial light by the organic electroluminescent layer of the corresponding counter electrode segment. The number of contact means applied to the counter electrode segments depends on the one hand on the resistance of the counter electrode and on the other hand on the size of the counter electrode segment. For known electroluminescent devices it has shown to be preferable that the following numbers of contact means are applied to the counter electrode segments: 2, 4, 5, 8, 16 or 32.

In another preferred embodiment the electroluminescent device comprises a control element to operate the counter-electrode-segments independently. The control element is used to steer the electrical current flowing into the counter-electrode-segments of the electroluminescent device. It is preferably be used for the individual activation of each of the counter-electrode-segments. In a preferred embodiment, the control element is an active circuit or an integrated circuit. The named circuits are easy to apply to the electroluminescent device and even a plurality of electroluminescent devices can be controlled with just one control element. Furthermore, the control element may receive a control signal via the connection to the electrical source. The connection—for example a wire—does not only transfer the electrical energy but also a control signal. The control element enables it to control the operation conditions of the counter-electrode-segments individually. For example, a first counter-electrode-segment may be operated at high brightness and an adjacent counter-electrode-segment may be operated at low brightness or the color of the emitted light may be adjusted differently for different counter-electrode-segments using electroluminescent layer stack with two or more different organic electroluminescent layers.

The object of the invention is also solved by a method for segmentation of a counter electrode of an electroluminescent device into a plurality of electrically separated counter-electrode-segments, comprising a substrate and on top of the substrate a substrate electrode, a counter electrode and an electroluminescent layer stack with at least one organic electroluminescent layer arranged between the substrate electrode and the counter electrode, and wherein an encapsulation means at least encapsulates the electroluminescent layer stack, the method comprising the steps:

a. applying at least one protective means to the substrate electrode, wherein the protective means is electrically non-conductive,
   b. depositing the electroluminescent layer stack of at least one contiguous layer on top of the substrate electrode and the applied protective means,
   c. depositing one contiguous counter electrode on top of the electroluminescent layer stack, and
   d. inserting at least one divide into the contiguous counter electrode above a path of the protective means, to segment the counter electrode into the plurality of electrically separated counter-electrode-segments, wherein the protective means exceeds the divide.

Details and features described with reference to the electroluminescent device also apply to the disclosed method and vice versa. In the disclosed method the divide is inserted into the counter electrode after deposition and not formed by a separator as in prior art. Therefore, no separator has to be applied to the substrate electrode. Instead of this, the divide is directly inserted into the continuous counter electrode. The disclosed method therefore needs a reduced number of steps compared to the prior art. Furthermore, the disclosed method does not require lithographic and/or mask processes to produce the divide.

The invention discloses, that the electroluminescent layer stack with at least one organic electroluminescent layer is deposited in one continuous, non-structured layer on top of the substrate electrode. The electroluminescent layer stack is not divided into segments by the protective means. The segmentation of the counter electrode and—possibly—at least parts of the electroluminescent layer stack is done by inserting at least one divide. The organic electroluminescent layer is therefore not segmented by the protective means but by the divide, which is applied after the deposition of the named organic electroluminescent layer. Furthermore, the divide follows the path of the protective means. This feature discloses that the course of the divide always follows the path of the protective means. Obviously, the application of the protective means to the substrate electrode determines the course of the divide in the otherwise non-structured counter electrode. The substrate area covered by the protective means predetermines the shape of the counter electrode segments separated by the applied divide and can be varied individually for each electroluminescent device by adjusting the deposition process for the protection means. This allows a flexible and individual structuring of electroluminescent devices in contrast to prior art.

The protective means is a layer which protects the organic layers and the counter electrode against any negative effect from the divide by insulating the substrate electrode reliably towards the counter electrode. Thus, no short will occur, as the protective means prevents any direct contact between the two electrodes. The protective means may comprise non-conductive glue or photoresist. The area of the protective means may further extend over the area of the divide.

A preferred embodiment of the disclosed method is characterized in that the divide is inserted into the counter electrode with a mechanical tool, preferably a knife or a scalpel, and/or a laser. The divide can easily be inserted by one of the named tools into the counter electrode. As the protective means protects the substrate electrode from any damage or the occurrence of a short, there is no need to use sophisticated means for inserting the divide into the counter electrode. People skilled in the art may choose alternative mechanical tools to apply a divide within the scope of this invention.

In another preferable embodiment of the method the counter electrode segments are connected to the encapsulation means by applying a contact means on top of each of the electrically separated counter electrode segments. In this embodiment on top of each of the counter electrode segments an individual contact means is applied. The contact means is used to connect the counter electrode segments to an electrical source. By individually applying one contact means to each of the electrically separated counter electrode segments, each of the counter electrode segments can either be individually driven and/or a homogenous distribution of the electrical current through the electroluminescent device can be achieved. A further preferred embodiment is characterized in that the step of applying the contact means is performed above the protective means, wherein the protective means exceeds the contact means. By using this step it is guaranteed, that the contact means itself and/or the application of the contact means does not lead to a short. The contact means and/or the application of the contact means may lead to damage and/or a perforation of the counter electrode segments. These parts of the contact means may reach the substrate electrode and lead to a short. This is prevented by the protective means, which is arranged on the substrate electrode and exceeds the contact means. Therefore, no parts of the contact means and/or parts of the counter electrode segments deformed by the contact means can reach the substrate electrode.

The invention also discloses the use of at least one electrically non-conductive protective means for protecting a substrate electrode of an electroluminescent device according to our present invention from a divide, used for segmentation of an otherwise non-structured counter electrode. The claimed protective means is arranged on the substrate electrode and prevents electrical contact between the divided counter electrode and the substrate electrode. Therefore, the protection means works as a kind of shield from the divide, separating the counter electrode in a plurality of counter-electrode-segments. Furthermore, the invention discloses the use of non-conductive glue as an electrically non-conductive protective means for protecting a substrate electrode of an electroluminescent device according to our invention from a divide, used for segmentation of an otherwise non-structured counter electrode. The claimed non-conductive glue can easily be applied to the substrate electrode.

The invention also discloses the use of conductive glue for contacting an electrically separated counter-electrode-segment of an electroluminescent device according to our invention. The advantage of using conductive glue compared to the known means used for contacting the counter electrode is the easy application an electrical connection between counter electrode and encapsulation means without complex manufacturing processes.

To produce the disclosed electroluminescent device of the invention, the different layers of the layer stack are deposited onto the substrate. After depositing the substrate electrode onto the substrate, the protective means may be applied to the substrate electrode. Afterwards, the organic layers are deposited. Then the counter electrode is deposited. Finally, the divide is inserted into the otherwise contiguous counter electrode above a path of the protective means, to segment the counter electrode into the plurality of electrically separated counter-electrode-segments. According to the state of the art, the preferred deposition technology for the organic layers and the counter electrode is vacuum evaporation. Vacuum evaporation is a deposition technology, where the materials to be deposited follow a straight path from the evaporation source to the substrate, leading to a directed deposition. If the protective means has steep edges or overhanging edges, shadowing effects will occur, which lead to holes in the organic layers and the counter electrode. Edges leading to the emergence of shadowing effects are denoted as shadowing edges. To prevent this undesirable effect, it is preferable that the protective means has a smooth and/or continuous and/or non-steep edges and/or hill-like shape. Therefore, the invention also claims a protective means with a shape and/or comprising material properties and/or application procedures that prevents the emergence of a shadowing edge on a substrate electrode. In a preferred embodiment the material property preventing the emergence of a shadowing edge is the viscosity, e.g. the viscosity at enhanced temperature. Preferably the viscosity is low. If non-conductive glue is used as protective means it may be applied in liquid form onto the substrate electrode. If this non-conductive glue of the protective means comprises a viscosity that enables it to flow, a smooth hill-like shape of the protective means will result, which prevents shadowing effects. If a material is used for the protective means that gives rise to steep edges several deposition sources could be used to deposit material from different directions onto the substrate to prevent the emergence of shadowing effects. It may also be advisable to rotate or otherwise move the substrate during deposition to ensure a continuous layer deposition over the protective means.

The invention also relates to a substrate covered by only one contiguous electrode with at least one protective means on top of the electrode to be used as the substrate electrode in an electroluminescent device according to our present invention. The term "contiguous" denotes any substrate electrode, where the substrate area coated with the substrate electrode is not adapted to apply a second conductive area onto the substrate within the encapsulated area of the substrate area of an organic electroluminescent device covered by an encapsulation means, which is electrically isolated to the substrate electrode.

The aforementioned electroluminescent device and/or method, as well as claimed components and the components to be used in accordance with the invention in the described embodiments are not subject to any special exceptions with respect to size, shape, material selection. Technical concepts such that the selection criteria are known in the pertinent field can be applied without limitations. Additional details, characteristics and advantages of the object of the present invention are disclosed in the subclaims and the following description of the respective figures—which are an exemplary fashion only—showing a plurality of preferred embodiments of the electroluminescent device according to the present invention.

BRIEF DESCRIPTION OF THE DRAWINGS

Further embodiments of the invention will be described with respect to the following figures, which show.

DETAILED DESCRIPTION OF EMBODIMENTS

Figure 1:
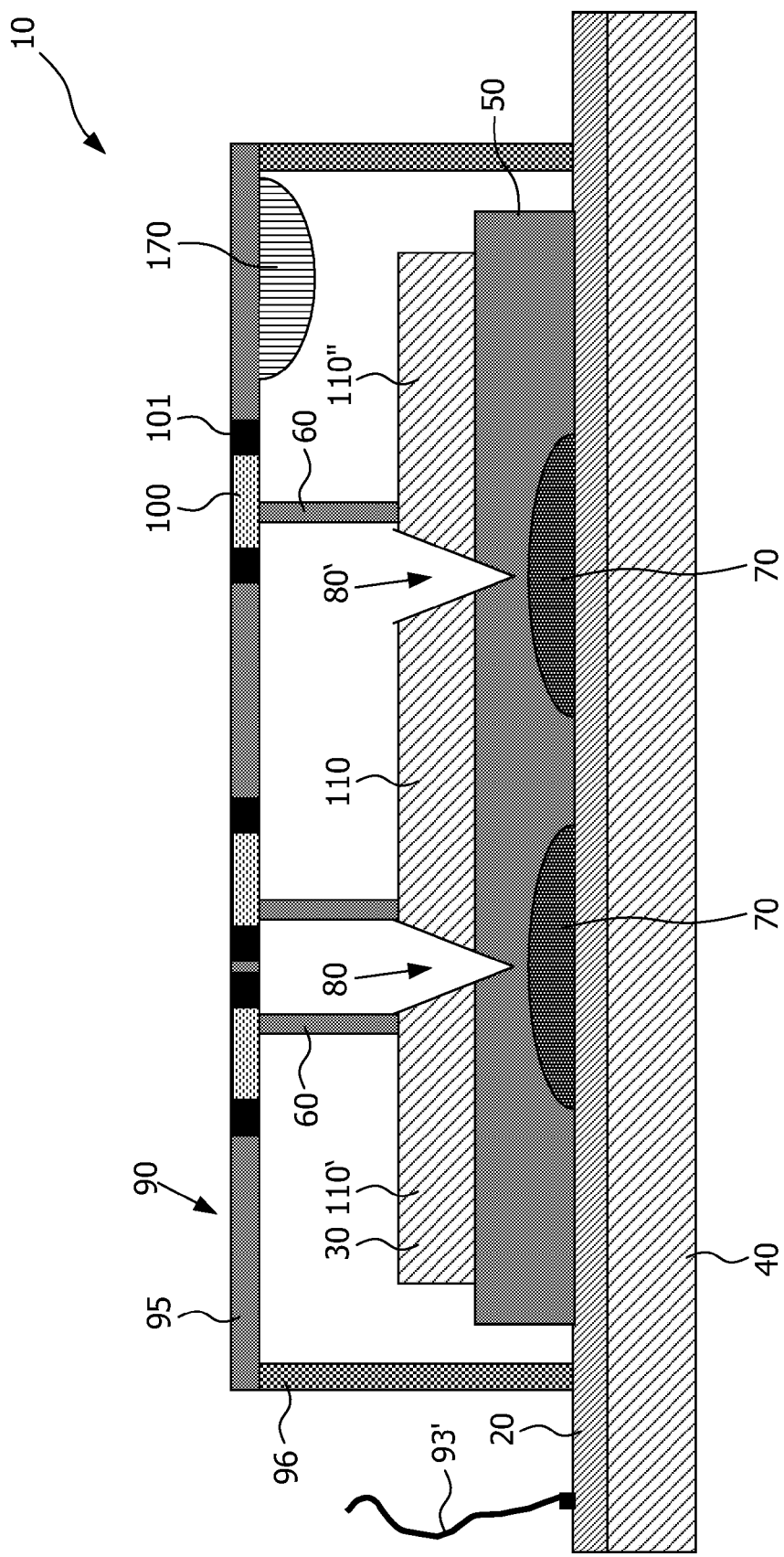
FIG. 1 a first embodiment of an electroluminescent device with a segmented counter electrode, FIG. 2 another embodiment of the electroluminescent device, FIG. 3 a top view of the electroluminescent device according to FIG. 2, FIG. 4 a further embodiment of the electroluminescent device, FIG. 5 a top view of the electroluminescent device according to FIG. 4, FIG. 6 another embodiment of the electroluminescent device, FIG. 7 a top view of the electroluminescent device according to FIG. 6, FIG. 8 another embodiment of the disclosed electroluminescent device, FIG. 9 a top view of the electroluminescent device, FIG. 10 another embodiment of the electroluminescent device, FIG. 11 a cutaway drawing of the electroluminescent device with a protective means and FIG. 12 a separator with shadowing edges as disclosed in the prior art.

In FIG. 1 an electroluminescent device 10 according to a first embodiment of the invention is shown. The electroluminescent device comprises a substrate electrode 20, a counter electrode 30 and an organic electroluminescent layer 50 as the electroluminescent layer stack in this and the following examples. The organic electroluminescent layer 50 is arranged between the substrate electrode 20 and the counter electrode 30 forming a layer stack. This layer stack is arranged on a substrate 40. In the shown embodiment the substrate electrode 20 is formed by an approximately 100 nm thick layer of ITO, which is a transparent and conductive material. Onto this substrate electrode 20 the organic electroluminescent layer 50 is deposited. If a voltage is applied between the substrate electrode 20 and the counter electrode 30 some of the organic molecules within the organic electroluminescent layer 50 are exited, resulting in the emission of artificial light, which is emitted by the electroluminescent layer 50. The counter electrode 30 is formed by a layer of aluminum, working as a mirror reflecting the artificial light through the substrate electrode 20 and the substrate 40. To emit light into the surrounding, the substrate 40 in this embodiment is made of glass. Thus, the electroluminescence device according to FIG. 1 is a bottom emitting OLED. The electroluminescence device 10 shown in the following figures as well as its components and the components used in accordance with the invention are not shown true to scale. Especially the thickness of the electrodes 20, 30, organic electroluminescence layer 50 and substrate 40 are not true to scale. All figures just serve to clarify the invention.

As can be seen in FIG. 1 the organic electroluminescent layer 50 and the counter electrode 30 are encapsulated by an encapsulation means 90. This encapsulation means 90 comprises a lid-like shape. Furthermore, the electroluminescent device 10 comprises at least one contact means 60, for electrically contacting the counter electrode 30 to an electrical source. The contact means 60 is therefore a part of the conducting path leading from the counter electrode 30 to the electrical source.

The aim of the present invention is to achieve an electroluminescent device 10 with a plurality of electrically separated segments, which can easily be produced. In FIG. 1 it is shown that the counter electrode 30 is divided by two divides 80, 80' into a plurality of electrically separated counter-electrode-segments 110, 110', 110''. In the following, the separated counter-electrode-segments 110, 110', 110'' are also denoted as segments 110, 110', 110''. A protective means 70 is applied to the substrate electrode 20. This protective means 70 is electrically non-conductive. Furthermore, the electrically non-conductive protective means 70 is arranged below the divide 80, 80' on the substrate electrode 20 exceeding the divide 80, 80'. The protective means 70 is arranged on the substrate electrode 20 with a shape suitable to prevent the emergence of a shadowing edge. Thus, in the shown embodiment, the protective means 70 is formed by non-conductive glue and possess a smooth hill-like shape with no shadowing edge, which may lead to holes in the organic electroluminescent layer 50 and the counter electrode 30. The non-conductive glue of the protective means 70 is applied to the substrate electrode 20 and afterwards it is possible to insert the divide 80, 80' into the counter electrode 30. This may be done by a mechanical tool or a laser. By dividing the counter electrode 30 a plurality of segments 110, 110', 110'' are established. The protective means 70 ensures that no short between the two electrodes 20, 30 can occur. Furthermore, the protective means 70 prevents during the insertion of the divide 80, 80' that the substrate electrode 20 is damaged. The divide divides at least the counter electrode, but may also divide parts of the electroluminescent layer stack 50 or may even extend to the protection means.

In the embodiment of FIG. 1 the contact means 60 are electrically conductive glue applied to the counter electrode 30. The encapsulation means 90 comprises three electrically conductive contact areas 100. As can be seen in FIG. 1 the conductive glue of the contact means 60 are in direct contact with the contact areas 100 of the encapsulation means 90. The user of the electroluminescence device 10 according to FIG. 1 just has to connect the contact areas 100 with an electrical source to generate artificial light. As each contact area 100 is more robust and larger than the contact means 60 and/or the counter electrode segments 110, 110', 110'' the connection to the electrical source can easily be done with known means. For example a wire can be welded to the contact area 100 of the encapsulation means 90. The contact area 100 may be formed by a metal disk embedded into the encapsulation means 90. This metal disk is electrically conductive and may therefore be used as a bridge between the contact means 60 and the electrical source. In the shown embodiment the encapsulation means 90 is positioned onto the substrate electrode 20 and also electrically conductive. To prevent a short, the encapsulation means 90 comprises an insulating border 101, which encircles the contact area 100. This prevents any direct contact between the contact area 100 and the top 95 of the encapsulation means 90. Apart from the shown embodiment, the contact area 100 may not only be formed by a disk embedded in the encapsulation means 90. It might also be that the encapsulation means 90 is a one piece element, which is partially doped with conductive particles, so that the conductive area 100 is formed. In this embodiment the rest of the encapsulation means, which is not conductive, insulates the contact area 100 against the substrate electrode 20.

In the shown embodiment the encapsulation means 90 is on the one hand based on the substrate electrode 20 and on the other hand in contact with the conductive glue of the contact means 60. To prevent a short at least a part of the encapsulation means 90 and/or the encapsulation means 90 as a whole must be insulated against the substrate electrode 20.

In the shown embodiment a top 95 of the encapsulation means 90 is electrically conductive, whereas a side 96 of the encapsulation means 90 is electrically insulating. Therefore, a short between the counter electrode 30 and the substrate electrode 20 is prevented. Depending on the type of use the encapsulation means 90 may possess the following properties:

|   | Property of the top 95 of encapsulation means 90 | Property of the side 96 of encapsulation means 90 |
|---|---|---|
| 1. | conductive | conductive |
| 2. | insulating | conductive |
| 3. | conductive | insulating |
| 4. | insulating | insulating |

In the first case the encapsulation means 90 must be insulated against the substrate electrode 20. Therefore, an insulating rim 94—shown in FIG. 4—must be applied to the encapsulation means 90. In the third case there would be no need for any insulating rim 94, as the side 96 of the encapsulation means 90 insulates the conductive top 95 against the substrate electrode 20. In the second case an electrically conductive feed through may be applied to the isolating top 95 of the encapsulation means to connect it with the contact means 60. The same applies in the fourth case, in which in the side 96 as well as the top 95 of the encapsulation means 90 are insulating. The substrate electrode 20 is connected to a power source via the connection means 93'. Suitable connection means 93' are known be people skilled in the art.

Figure 8:
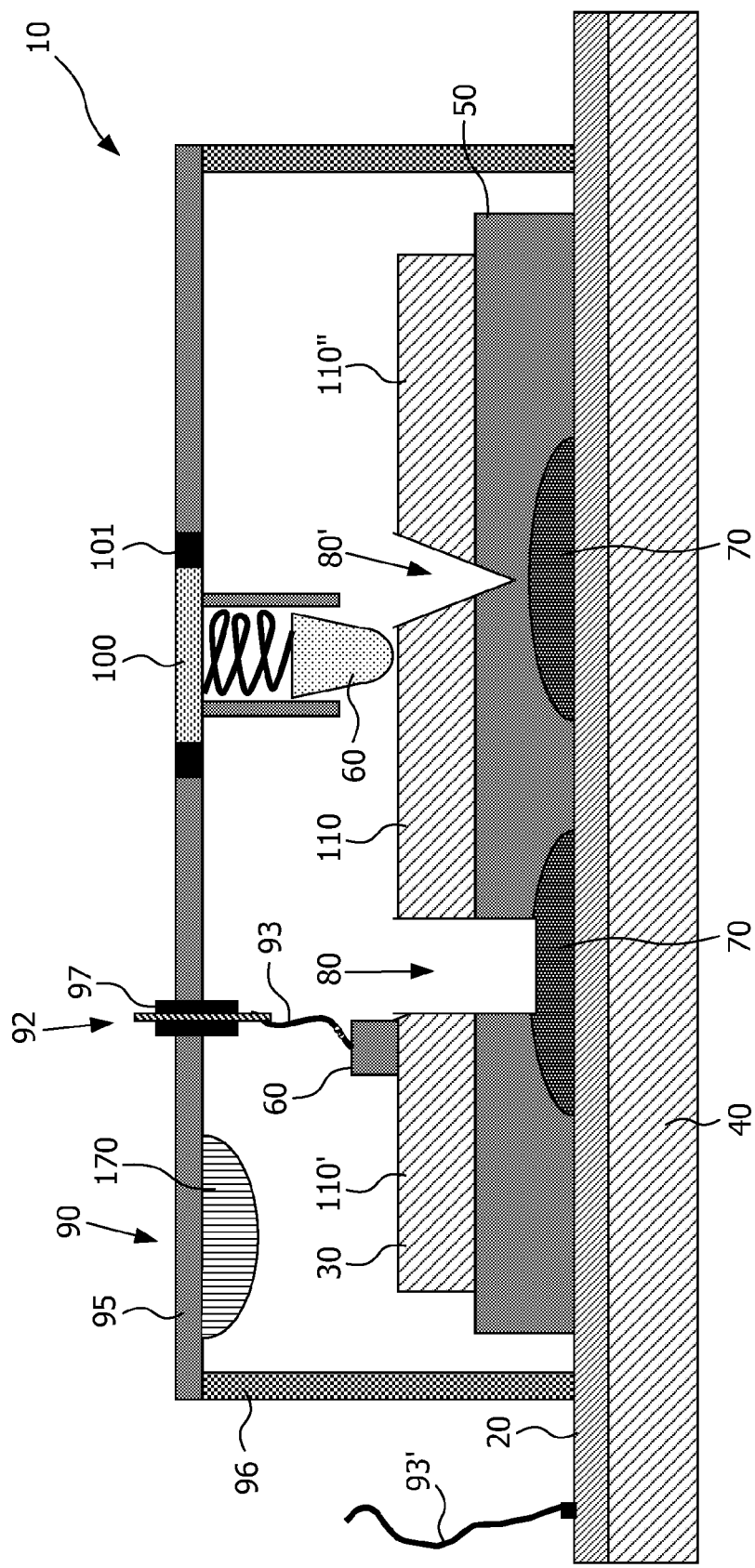

This shape of a cross-section of the divide 80, 80' depends on the tool used to insert the divide 80, 80' into the counter electrode 30 and possibly parts of the organic electroluminescent layer 50. Furthermore, the shape of the divide 80, 80' depends on the material properties of the counter electrode and/or the organic electroluminescent layer 50. The only aim, which has to be achieved by the divide 80, 80' is the secure separation of the counter electrode segments 110, 110', 110" so that no electrical contact between the counter electrode segments 110, 110', 110" can occur. To achieve this aim, the divide 80, 80' may have:

a "V"-shape (see FIG. 1),
 a "2-step"-shape (see FIG. 2) or
 a "U"-shape (see FIG. 8).

The named and shown shapes of the cross-section of the divide 80, 80' have just exemplary fashion. A divide 80, 80' may possess any cross-section, which is useful to achieve the named aim and which can be easily inserted into the counter electrode 30 of the electroluminescent device 10.

The electrically non-conductive protective means 70 is arranged below the divide 80, 80' on the substrate electrode 20 exceeding the divide 80, 80'. The notation that the protective means 70 is arranged below and exceeding the divide 80, 80' denotes that:

the protective means 70 is fully below the area, where the divide 80, 80' is inserted into the counter electrode 30 and
 the width covered by the protective means 70—the protective width 195—exceeds the width of the divide 80,80'—the divide width 190.

So the protective means 70 is at least fully covering the area below the divide 80,80'.

Figure 2:
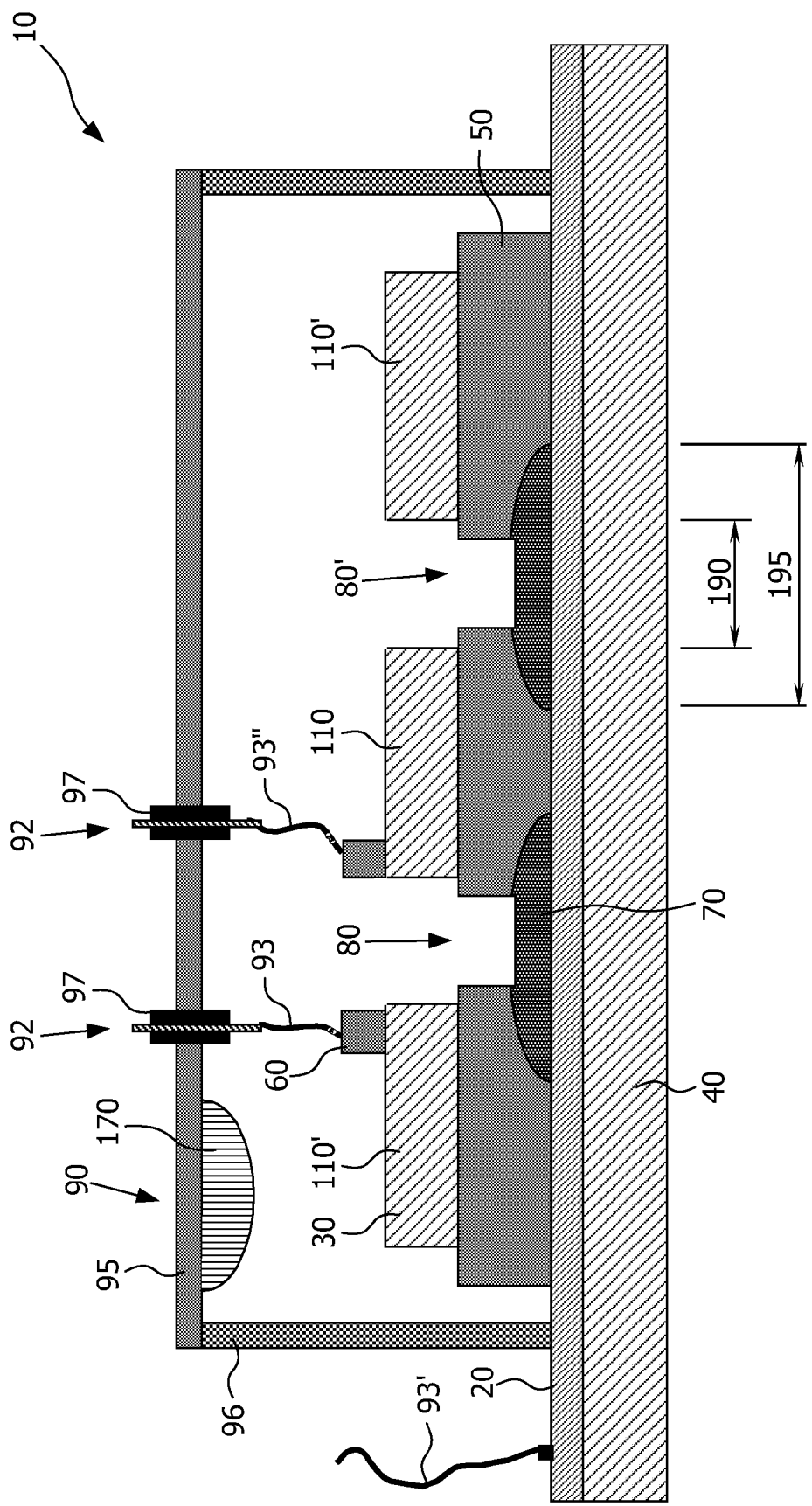

The divide 80, 80' comprises a width and a depth, which ensures that the segments 110, 110' have no electrical contact. Therefore, the divide width 190 of the divide 80, 80' may well be large compared to the thickness of the counter electrode 30. Furthermore, the divide 80, 80' may just penetrate the counter electrode 30 or may penetrate the counter electrode 30 and parts of the organic electroluminescent layer 50 or may penetrate all layers deposited on top of the protective means 70. In a differing embodiment, the divide 80, 80' not only separates the counter electrode 30 into a plurality of segments 110, 110' but also the electroluminescent layer 50. This is shown in FIG. 2 and FIG. 8. In FIG. 8 the electroluminescent device 10 comprises a "U"-shaped divide 80, 80'. This is in contrast to the "V"-shaped divide 80, 80' shown in FIG. 1. The "U"-shaped divide 80, 80' of FIG. 8 separates not only the counter electrode 30 but also the organic electroluminescent layer 50 in electrically separated sections. The protective means 70 prevents, that the divide 80, 80' reaches the substrate electrode 20.

Figure 3:
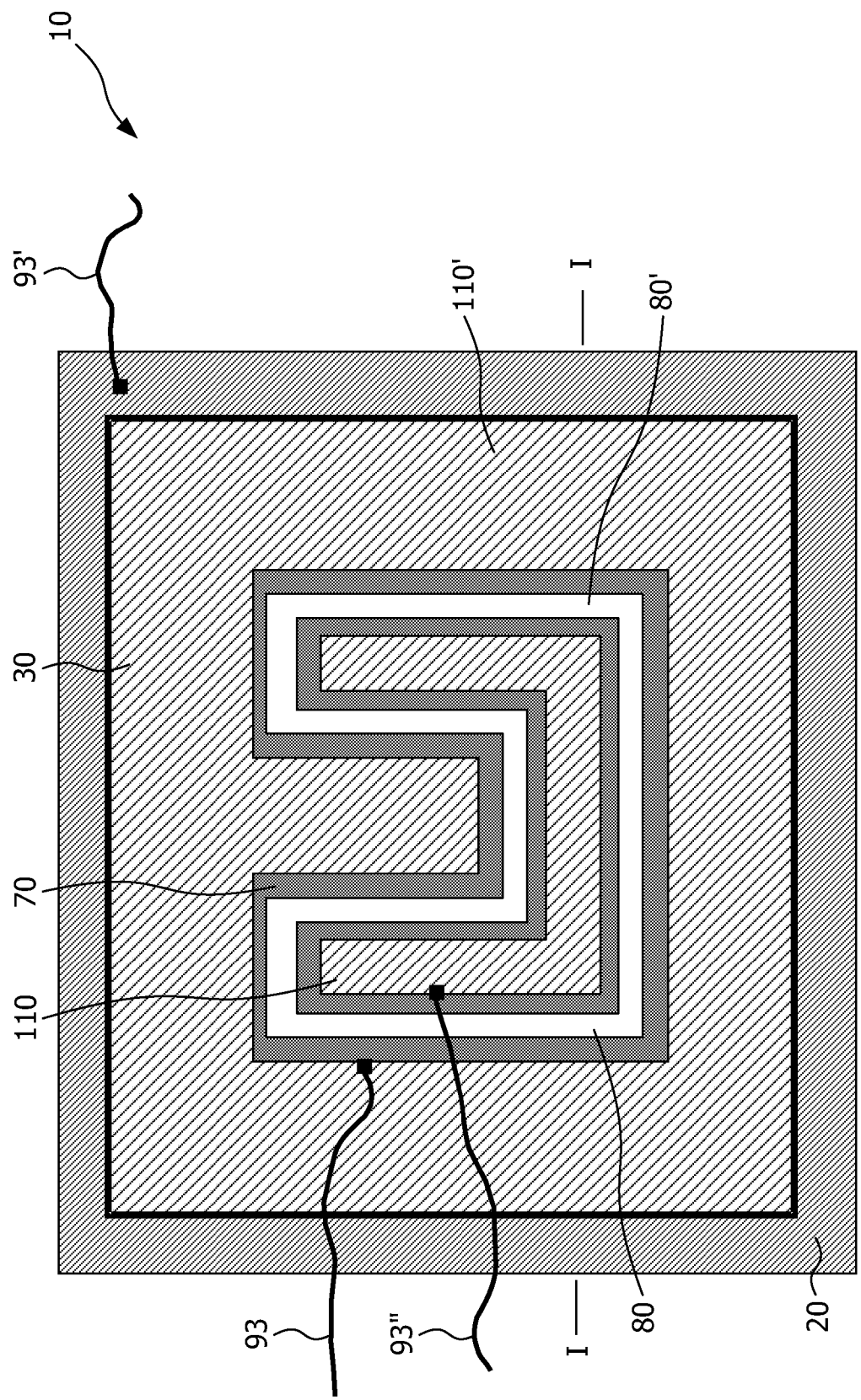

In the FIGS. 2 and 3 another embodiment of the disclosed electroluminescent device 10 is shown. The FIG. 2 shows a cross-sectional view of the electroluminescent device 10 of FIG. 3 along the cutting line I-I. As can be seen, the divide 80, 80' possesses a 2-step-shape, dividing the counter electrode 30 into two electrically separated counter electrode segments 110, 110'. Beneath the divide 80, 80' the protective means 70 is arranged on the substrate electrode 20. The shown protective means 70 comprises a smooth hill-like structure. Thereby, it is possible to deposit one continuous layer on top of the substrate electrode, forming the electroluminescent layer stack. After depositing one continuous counter electrode 30 on top of the electroluminescent layer stack, the divide 80, 80' can be inserted. The divide width 190 is smaller than the protective width 195. Therefore it is prevented that the inserting of the divide 80, 80' will damage the substrate electrode 20.

Furthermore, in FIG. 2 another embodiment of the encapsulation means 90 is disclosed. In this embodiment the encapsulation means comprises two electrically conductive gas tight feed throughs 92. These feeds throughs 92 are connected with the contact means 60. This might—as shown—be done by a connection means 93, 93', which is connecting on the one hand the feed through 92 and on the other hand the contact means 60. The connection means 93, 93' may be a wire, a foil or another electrically conductive element known to a person skilled in the art. It might also be that the feed through 92 is in direct contact with the contact means 60. So during the mounting of the encapsulation means 90 onto the layer stack, the gas tight feed through 92 might be pressed into the not hardened conductive glue of the contact means 60. After hardening there is an electrical contact between the gas tight feed through 92 and the contact means 60. On the outside of the encapsulation means 90, the gas tight feed through 92 may be contacted to an electrical source. In the shown embodiment it is assumed that the encapsulation means 90 as a whole is electrically conductive. Therefore, it is appropriate that the gas tight feed through 92 comprises an insulation means 97. This insulating means 97 prevents any short between the feed through 92—connected with the counter electrode 30—and the encapsulation means 90—connected with the substrate electrode 20. This insulating means 97 may be formed of ceramic, glass or made of re-melted glass-frit. If there is no insulating means 97 for the gas tight feed through 92, the top 95 of the encapsulation means 90 may also be insulating. Thus, a short between the two named electrodes 20, 30 is also prevented.

In FIG. 3 a top view of the electroluminescent device 10 according to FIG. 2 is shown. For easy understanding, the electroluminescent device 10 in FIG. 3 is shown without the encapsulation means 90. As can be seen, the counter electrode 30 is segmented in two separate segments 110, 110'. The shown electroluminescent device 10 comprises a substrate onto which a continuous substrate electrode 20 has been deposited. Onto the substrate electrode 20 the protective means 70 has been applied. The protective means 70 forms the outer boundary of the letter "U". Thus, the path of the protective means 70 is closed. On top of the protective means 70 and the substrate electrode 20 the continuous electroluminescent layer stack and the continuous counter electrode 30 have been deposited. Afterwards, the divide 80, 80' was inserted. This divide 80, 80' follows the path of the protective means 70 and segments the counter electrode 30 into two electrically separated counter electrode segments 110, 110'. As can be seen, the size of the protective means 70 exceeds the divide 80, 80'. One of the segments 110—the inner segment—forms the letter "U". The inner segment 110 is surrounded by the electrically separated outer segment 110'. As the inner segment 110 and the outer segment 110' are electrically separated, they can be driven individually. As FIG. 2 shows, each of the two named segments 110, 110' possesses a contact means 60. The contact means 60 are connected to the gas-tight feed throughs 92, which are insulated against one another through the insulating means 97. Therefore, each of the segments 110, 110' can individually be connected to an electrical source. This enables a user of the shown electroluminescent device 10 to choose whether:

the inner segment 110 should emit light,
the outer segment 110' should emit light or
both segments 110, 110' should emit light of equal or different brightness and/or color.

In a preferred embodiment the electroluminescent device may comprises a control element (not shown) to control and/or operate the counter-electrode-segments 110,110' independently.

Figure 4:
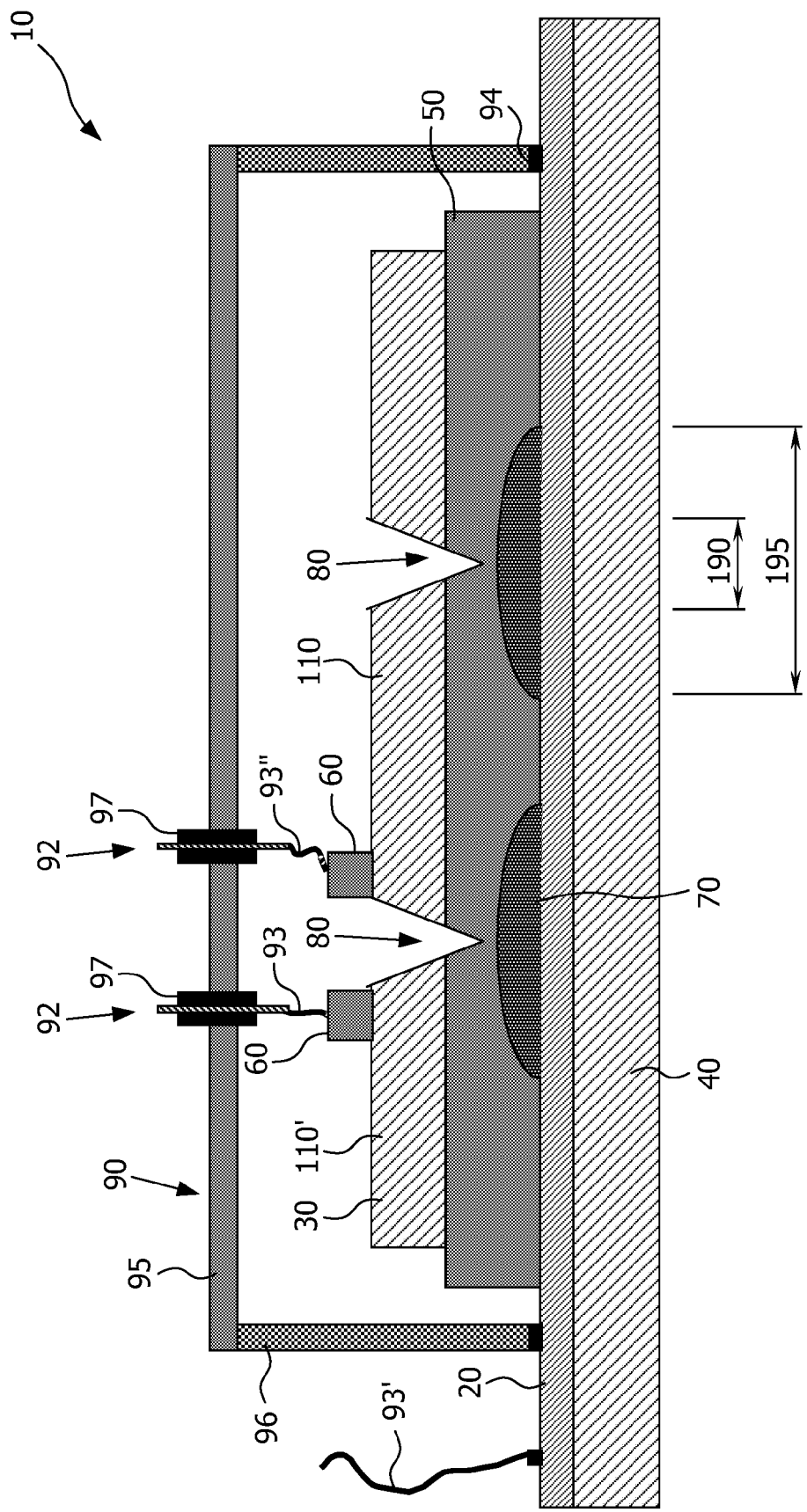
Figure 5:
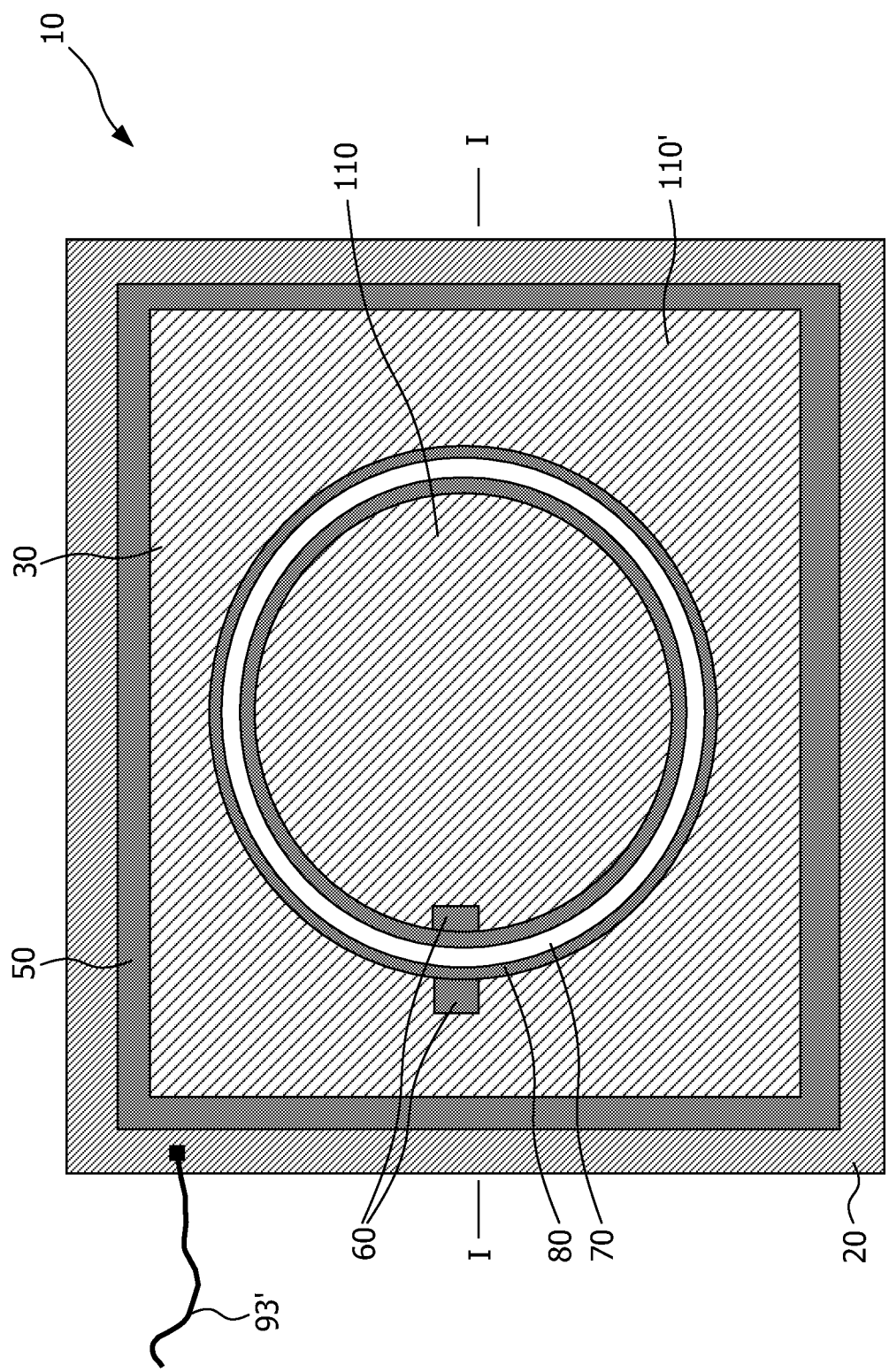

In the FIGS. 4 and 5 another embodiment of the disclosed electroluminescent device 10 is shown. The FIG. 4 shows a cross-sectional view of the electroluminescent device 10 of FIG. 5 along the cutting line I-I. Deviating from the electroluminescent device 10 of FIG. 2 the electroluminescent device 10 of FIG. 4 on the one hand comprises a "V"-shape divide 80, 80'. Such a divide can be inserted into the counter electrode 30 and parts of the organic electroluminescent layer 50 with a mechanical tool like a scalpel. Again the protective width 195 is larger than the divide width 190. Also the divide 80, 80' follows the path of the protective means 70. To ensure that during the deposition of the electroluminescent layer stack with the at least one organic electroluminescent layer 50 no holes or cavities occur, the protective means 70 comprises a smooth and/or continuous shape. This ensures that during deposition of the electroluminescent layer stack the deposited particles can cover the whole surface of the protective means 70.

As in FIG. 1 the contact means 60 in FIG. 4 has no direct contact with the top 95 of the encapsulation means 90. The connection means 93 may be a wire, but may also be any other means known by a person skilled in the art for bridging the gap between the conductive top 95 and the contact means 60. In the shown embodiment the top 95 as well as the side 96 of the encapsulation means 90 are electrically conductive. Therefore, the electroluminescent device 10 can be connected with an electrical source at any point of the encapsulation means 90. Due to its material property and/or size the encapsulation means 90 possesses a low resistance compared to the resistance of the counter electrode 30. Therefore, a user may take the most convenient section of the encapsulation means 90 to connect it to an electrical source. To prevent a short between the counter electrode 30 and the substrate electrode 20 an insulating rim 94 is applied to the electroluminescent device 10. This insulating rim 94 is arranged between the substrate electrode 20 and the side 96 of the encapsulation means 95. Therefore, there is no direct electrical contact between the substrate electrode 20 and the encapsulation means 90 nor the counter electrode 30.

As can be seen in FIG. 5, the protective means 70 forms a closed circle. Above a path of the protective means 70, forming a closed circle, the divide 80 is applied. Again an outer segment 110' and an inner segment 110 are formed. They can individually be driven by the two contact means 60, used to connect the segments 110, 110' to an electrical source.

Figure 6:
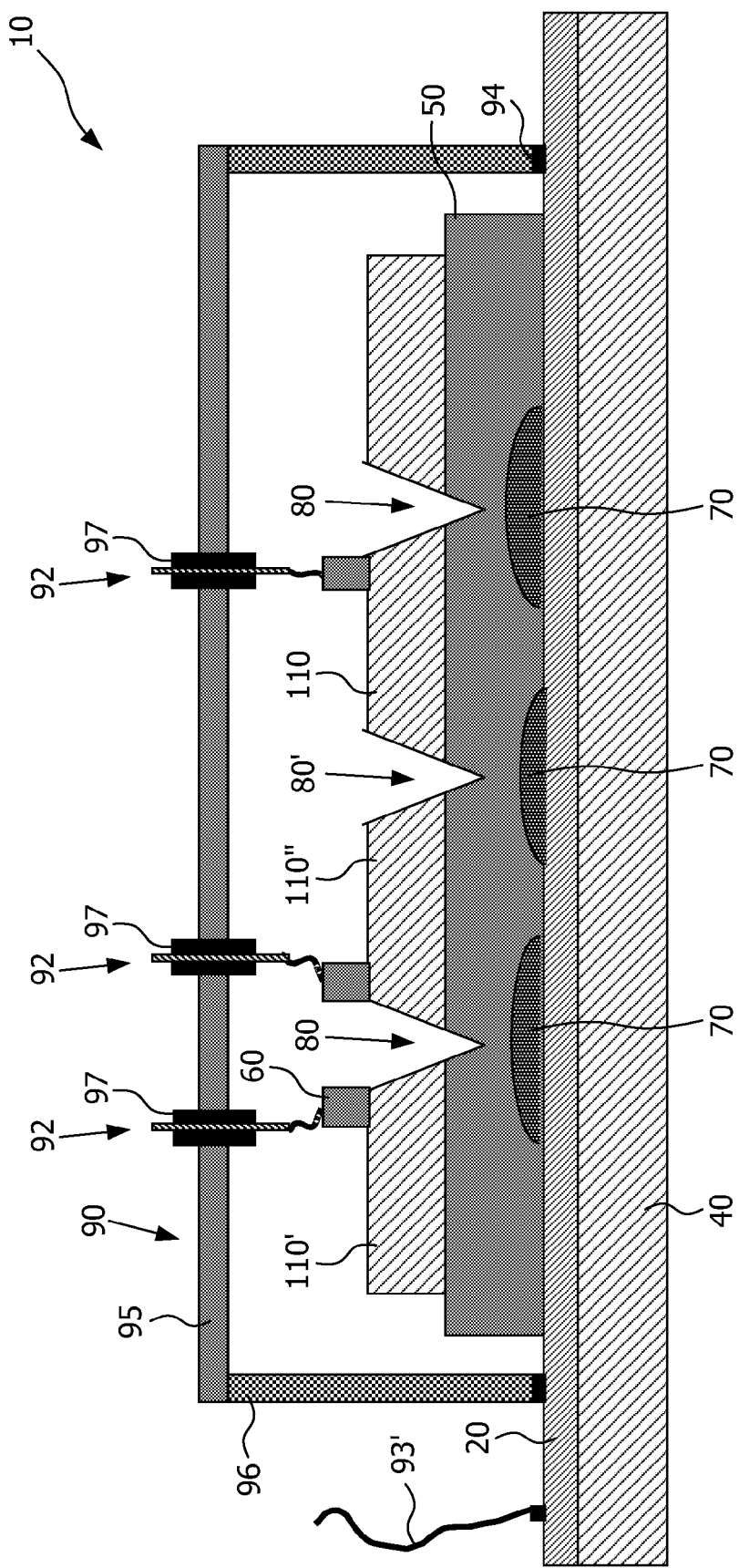
Figure 7:
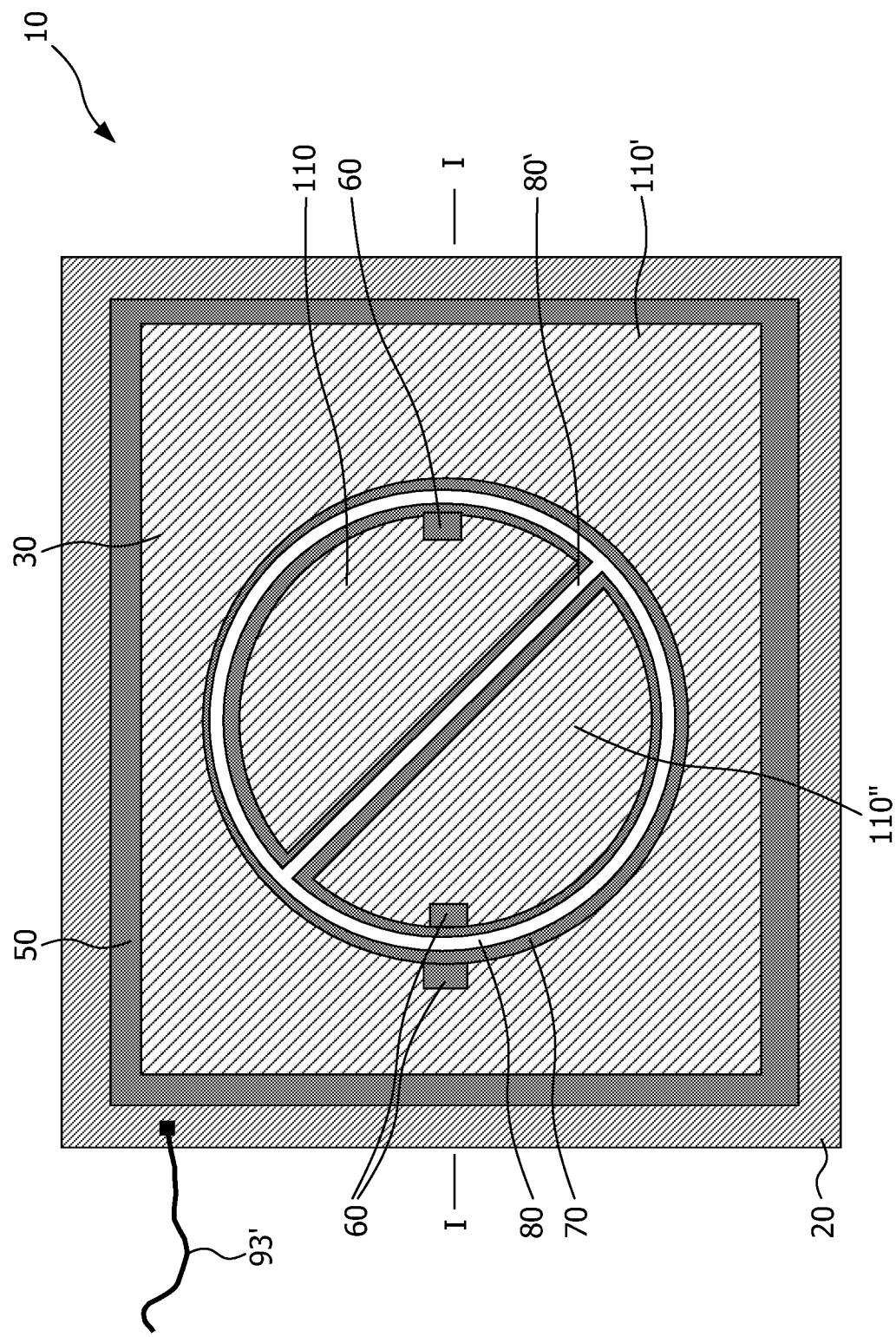

In the FIGS. 6 and 7 yet another embodiment of the disclosed electroluminescent device 10 is shown. The FIG. 6 shows a cross-sectional view of the electroluminescent device 10 according to FIG. 7 along the cutting line I-I. Deviating from the electroluminescent device 10 according to the FIGS. 4 and 5, the shown embodiment of the electroluminescent device 10 comprises a counter electrode 30, which is segmented into three electrically separated counter electrode segments 110, 110', 110". Each of the three segments 110, 110', 110" comprises a contact means 60. The contact means 60 are applied to the counter electrode in a position, where they are arranged above the protective means 70. Therefore, even if a contact means 60 damages the counter electrode 30 no short will occur, as the insulating protective means 70 will prevent this. Besides, the design and elements of the electroluminescent device 10 according to FIGS. 6 and 7 are identical to those of FIGS. 4 and 5.

In FIG. 8 another embodiment of the contact means 60 is shown. In this embodiment the contact means 60 comprises a means with a rounded tip, which is pressed by a spring onto the counter electrode 30. The means with a rounded tip and the spring are arranged within a guidance to ensure that the contact means 60 does not slip to a side. As the means with a rounded tip is pressed onto the counter electrode 30 there is a probability that it may penetrates the counter electrode 30 and the organic electroluminescent layer 50 and reaches the substrate electrode 20, which would lead to a short. To prevent this, the contact means 60 is arranged above the protective means 70. Even if the means with a rounded tip of the contact means 60 penetrates the counter electrode 30 and the organic electroluminescent layer 50 there would be no short. In the shown embodiment the area of the substrate electrode 20 below the contact means 60 covered by the protective means 70 (protective area) exceeds the area on the counter electrode 30 being in contact with the contact means 60 (contact area). All other features of the electroluminescent device 10 of FIG. 8 are in accordance with those of FIGS. 1 and 2.

Figure 9:
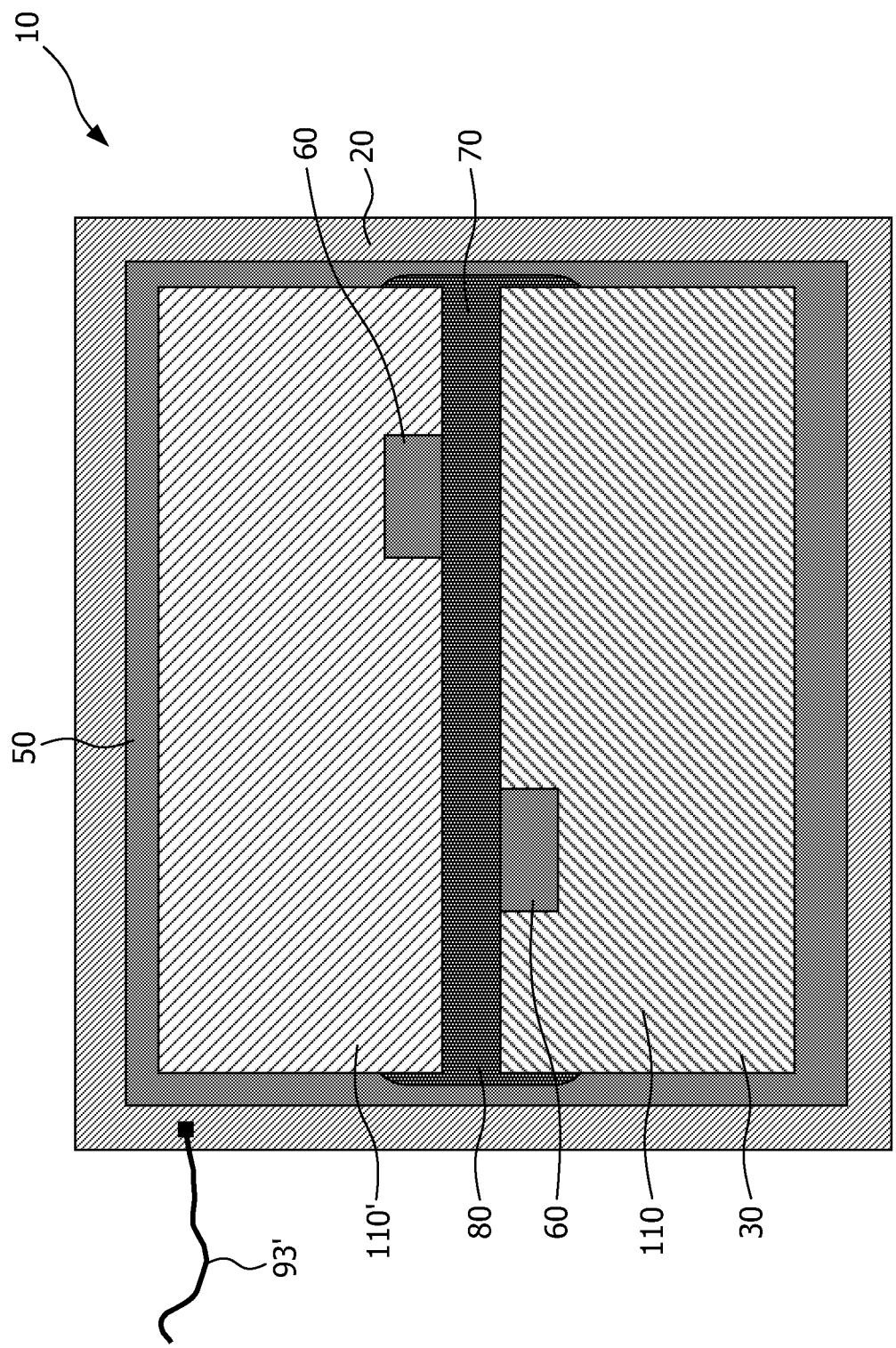

In FIG. 9 another top view of the disclosed electroluminescent device 10 is shown. The counter electrode 30 is divided by the divide 80 into two segments 110, 110'. Beneath the divide 80 a protective means 70 is arranged extending to the substrate electrode 20 in order to cover the full area of the divide 80. The protective means 70 ensures that while inserting the divide 80 no short between the two electrodes 30, 20 may occur. Furthermore, two contact means 60 are applied to the counter electrodes 30. These contact means 60 are arranged on the counter electrode segments 110, 110' in such a way that they are above the protective means 70. The electrically non-conductive protective means 70 is arranged on the substrate electrode 20 and is at least fully covering the area below the divide 80 and the contact means 60. This has the advantage that even if the application of the contact means 60 may damage the counter electrode 30 this would not lead to a short as this is prevented by the protective means 70. Thus, the protective means 70 prevents shorts, which may be due to the divide 80 or due to the contact means 60. The protective means arranged as a straight line in FIG. 9 is only an example. The protective means may be arranged differently depending on the desired segmentation of the counter electrode.

Figure 10:
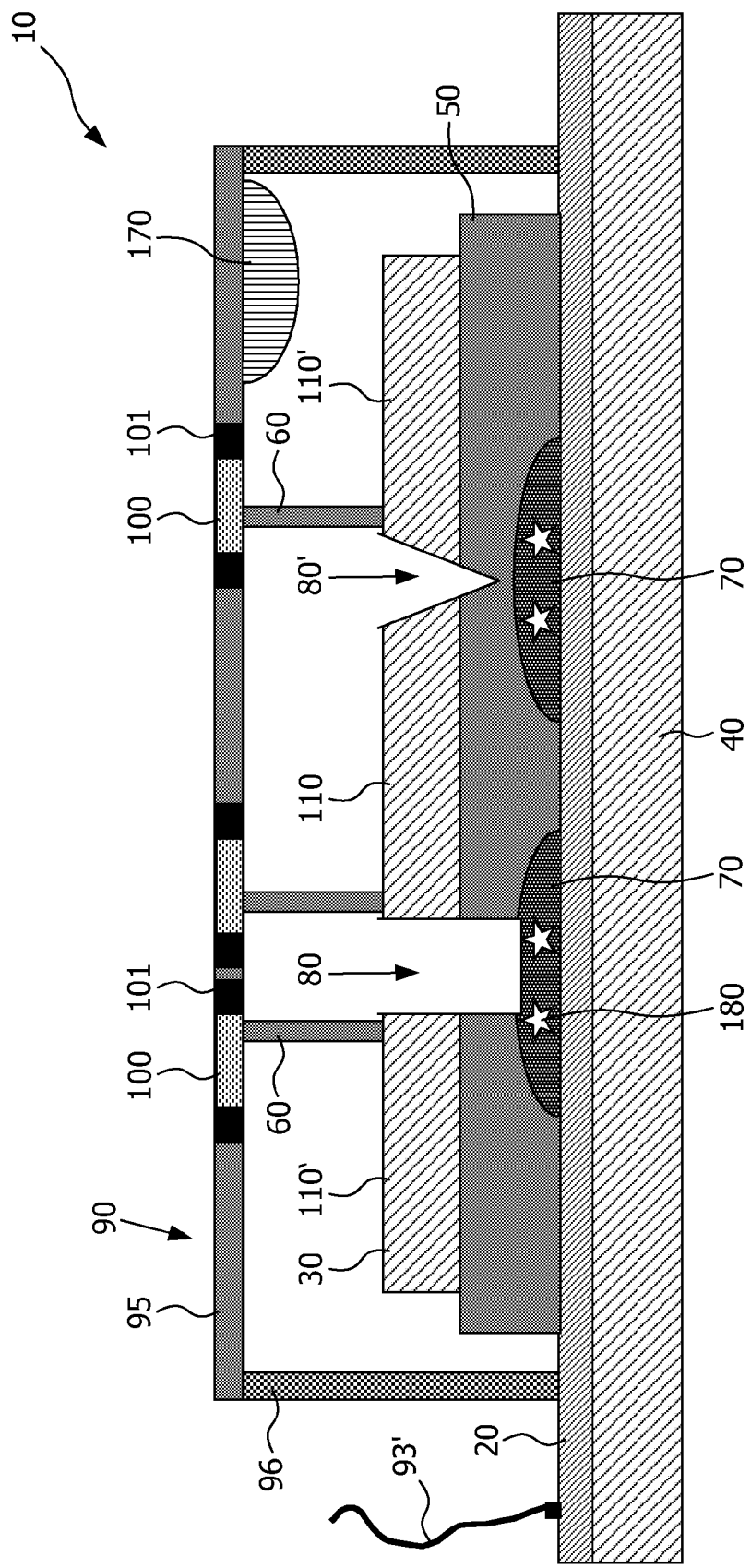

FIG. 10 shows another embodiment of the disclosed electroluminescent device 10. As has been discussed before, the protective means 70 is electrically non-conductive. Therefore, no current can flow from the counter electrode 30 towards the substrate electrode 20 in the region of the protective means 70. Therefore, the area beneath the protective means 70 may appear darker. Thus, it is preferable that the protective means 70 comprises at least one scattering means 180, for scattering a light, generated by the organic electroluminescent layer 50. The scattering means 180 may comprise and/or be pigments and/or particles. This prevents that the area beneath the protective means 70 might appear darker than its surrounding. These scattering means 180 may comprise mica or aluminum flakes or a material with a high refractive index like $TiO_2$ particles. The scattering means 180 also reflect parts of the artificial light and/or of visible light guided in the substrate 40 and therefore brighten the otherwise non-emissive layer beneath the protective means 70. All other features of the electroluminescence device 10 are in correspondence with electroluminescence device 10 shown in the FIGS. 1 and 2.

Figure 11:
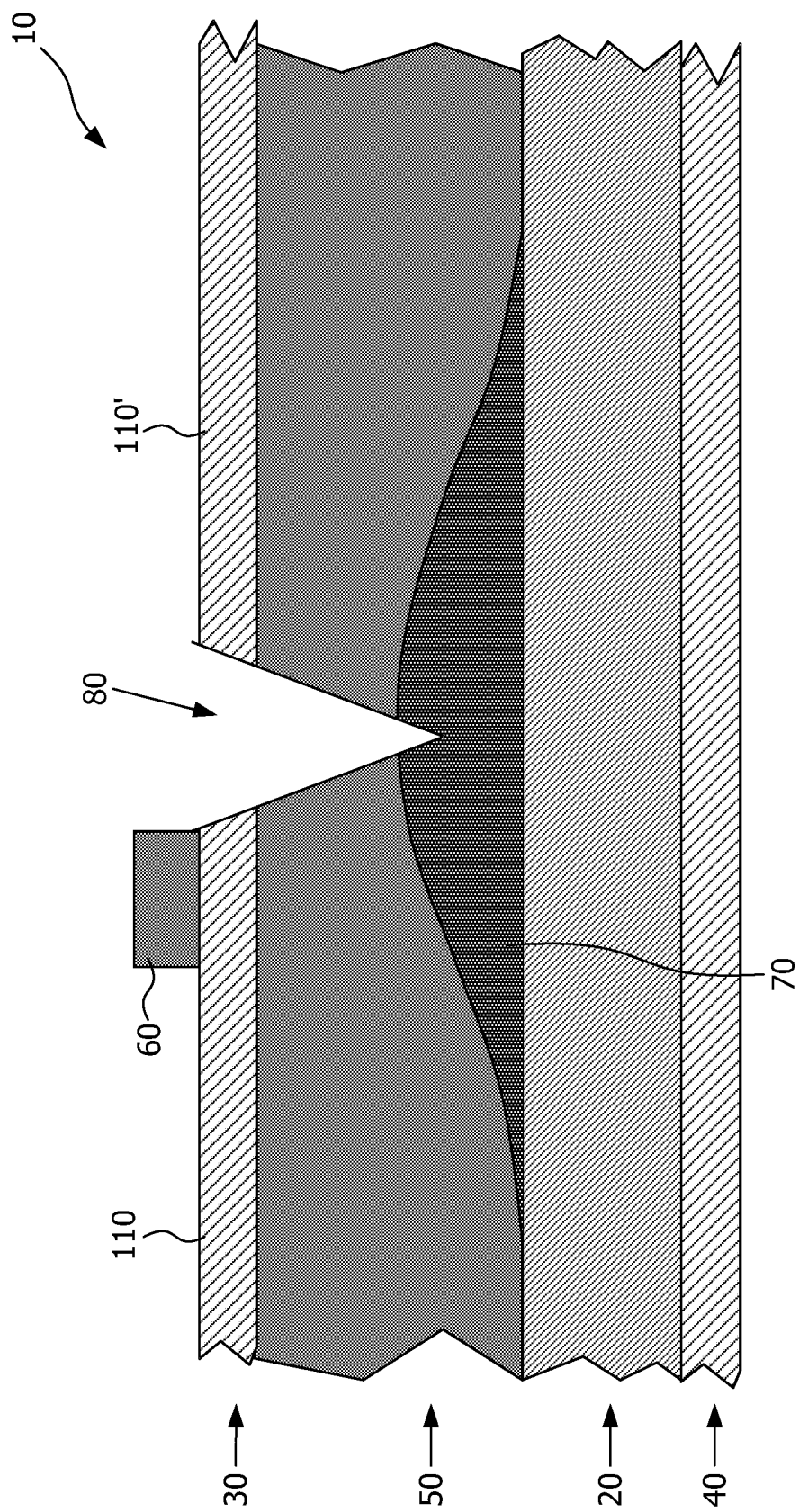

In FIG. 11 a part of the electroluminescence device 10 is shown. The FIG. 11 is a magnification of the layers deposited on the substrate 20. It shall be noticed, that the size of the layers are not true to the scale. Onto the substrate 40 the substrate electrode 20 is deposited. Onto this substrate electrode 20 the protective means 70 is arranged. The protective means 70 is embedded in the organic electroluminescence layer 50. Onto this organic electroluminescence layer 50 the counter electrode 30 is deposited. To connect the counter electrode 30 to an electrical source the contact means 60 is applied to the counter electrode 30. In the shown embodiment the contact means 60 is conductive glue and the protective means 70 comprises non-conductive glue. After applying the different layers to the substrate 40 the divide 80 can be inserted into the counter electrode 20 and at least partially into the organic electroluminescent layer 50. This can be done by a mechanical tool like a scalpel. This mechanical tool cuts the counter electrode 30 into two segments 110, 110', which can—as discussed above—be individually driven. Due to the protective means 70 no short between the substrate electrode 20 and the counter electrode 30 can occur.

The different electrodes 20, 30 and the electroluminescence layer 50 are applied in layers to the substrate 40. After applying the substrate electrode 20, the protective means 70 has to be deposited onto the substrate electrode 20. The protective means 70 is arranged on the substrate electrode 20 with a shape suitable to prevent the emergence of a shadowing edge. Therefore, the protective means 70 may comprise a material property that prevents the emergence of a shadowing edge on the substrate electrode 20. If the protective means 70 would comprise very rigid material, it might have vertical or near vertical edges. After applying such a protective means 70 during the deposition of the organic electroluminescence layer 50 voids or cavities at the sides of the protective means 70 would occur. To prevent this, the protective means 70 must comprise a material property that prevents such shadowing edges. In a preferred embodiment the material property is the viscosity. Therefore, the material forming the protective means will flow on the substrate electrode 20. There will be no shadowing edges. The protective means 70 preferably comprises a viscosity at enhanced temperature that enables a two step application procedure. In a first step the material forming the protective means—like non-conductive glue—is applied to the substrate electrode 20. Due to its viscosity, the material of the protective means 70 will flow outwards on the substrate electrode. Preferably the material of the protective means 70 comprises a material property that enables it to flow slowly, to form a hill-like shaped protective means 70 with a defined thickness. Then the temperature of the protective means and/or the material of the protective means is increased, lowering the viscosity and thus forming a very smooth shaped deposit. Then it should solidify, to finally form the protective means 70. This ability and/or material property of the protective means to flow onto the substrate electrode 20 in such a way, that no shadowing edges are formed enables the manufacturing of the disclosed electroluminescence device 10.

Figure 12:
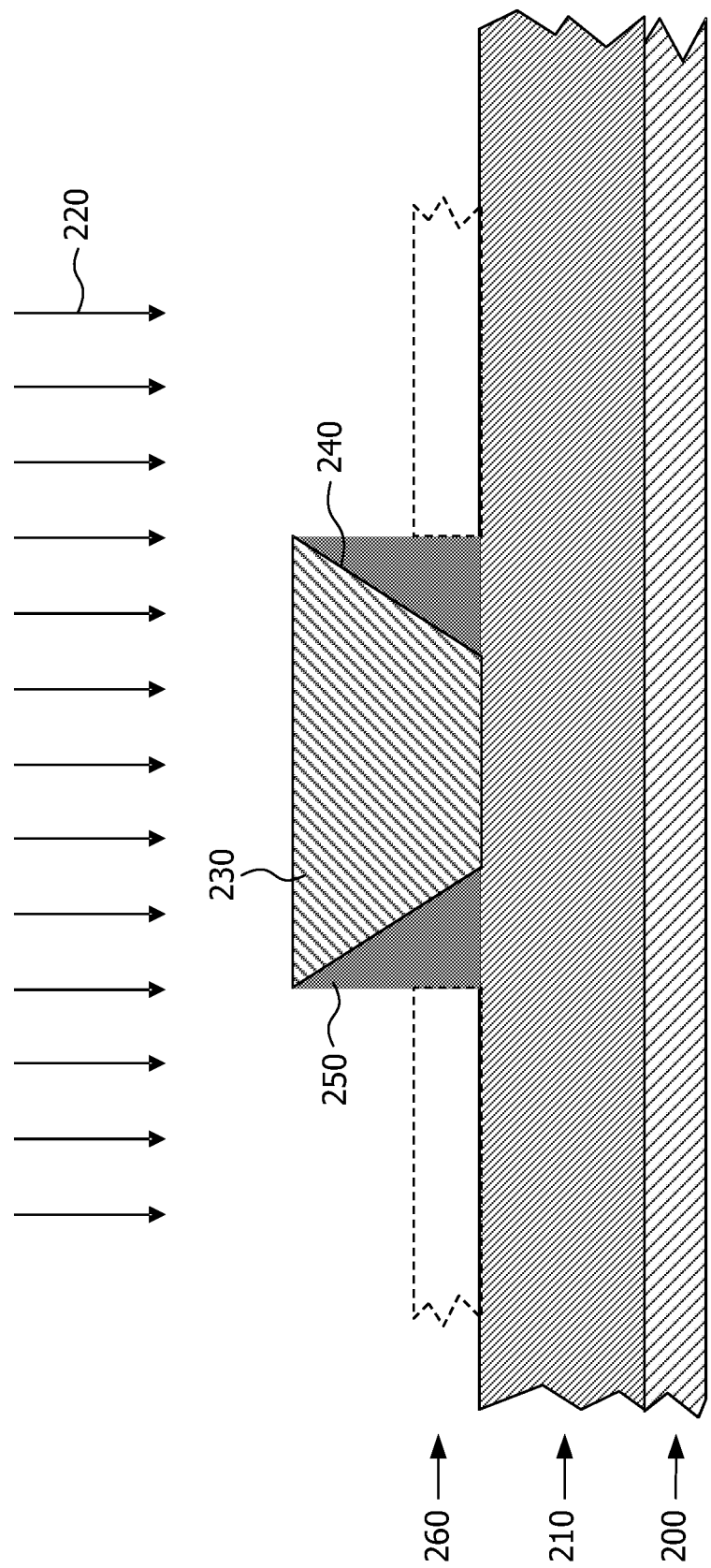

To further explain the invention, in FIG. 12 a cross-section of an electroluminescent device being produced according to the method disclosed in the prior art is shown. In the US 2005/142 974 A1 it is disclosed to use separators 230 to divide a counter electrode into electrically separated segments. As FIG. 12 shows onto the substrate 200 a substrate electrode layer 210 is deposited. On top of this substrate electrode layer 210 separators 230, which comprise an inverted taper shape are deposited. To deposit a layer vacuum evaporation may be used. As has been said, vacuum evaporation is a deposition technology, where the material to deposit follows a straight path from the evaporation source to the substrate electrode layer 210, as shown by the arrows 220. As the separators 230 comprise an inverted taper shape, they also possess a shadowing edge 240. As the deposition 220 of the material is done more or less orthogonal to the substrate layer 200, the shadowing edges 240 shield parts of the substrate electrode layer 210. Therefore, shielded areas 250 occur, in which no material can form the deposited layer 260. To prevent such shielded areas 250, the invention discloses that the protective means 70 comprises a shape that is suitable to prevent the emergence of shadowing edges 240. The shape of the protective means 70 guarantees that no shielded areas 250 occur during the deposition 220 of material. Therefore, during the deposition of the electroluminescent layer stack and/or the counter electrode continuous layers are produced. The separation of the counter electrode 30 into a plurality of electrically separated counter electrode segments 110, 110', 110" is not done by the protective means 70 itself. In the invention the divide 80, 80' has to be inserted into the otherwise non-structured, continuously applied counter electrode and/or electroluminescent layer stack.

In an experiment, the protective means was made of a two-component epoxy glue (UHU plus schnellfest, curing time 5 min). The binder and the hardener were mixed in the prescribed ratio of 1:1 and then applied at room temperature to the ITO-covered glass substrate in a closed loop. Then the substrate was heated on a hot plate to 60° C. for 15 min, which allowed the glue first to flow into a smooth hill and then to solidify rapidly. The procedure was carried out in a glove box in dry Nitrogen atmosphere (less than 1 ppm of water). The substrate with the hardened protective means was then introduced into a vacuum chamber and the organic layers and the counter electrode were deposited. Then the divide was created by removing the counter electrode and the organic layers above the closed loop of the protective means with a scalpel. The finished device was then encapsulated with a glass cover lid having two holes at the positions of the protective means of the divide. The cover was applied by UV curing glue. A getter for water was placed in the cavity formed by the substrate and the lid. In a last step, conductive glue (Circuitsworks conductive epoxy CW2400 from Chemtronics Inc.) was applied though the holes in the cover lid to the counter electrode at two positions of the protective means and two brass plates with small brass springs were attached with two component epoxy to the cover lid, closing the holes in the cover lid in such a way that the brass springs were embedded in the conductive glue. After setting of all glues (appr. 1 hour), the OLED was reliably driven by connecting the plus lead of a power supply to the rim of the substrate where the substrate electrode was exposed and the minus lead to one, or both of the brass plates on the cover lid. The electroluminescent layer stack and the counter electrode made of Aluminum covered the protective means without cracks or holes. At the position of the protective means, there was no light emission.

In a second experiment, the binder of the glue was mixed with $TiO_2$ particles, leading to a white substance. The rest of the procedure followed exactly the description give above. After setting of all glues (appr. 1 hour), the OLED was reliably driven by connecting the plus lead of a power supply to the rim of the substrate where the substrate electrode was exposed and the minus lead to one, or both of the brass plates on the cover lid. The electroluminescent layer stack and the counter electrode made of Aluminum covered the protective means without cracks or holes. At the position of the protective means, there was no light emission due to the scattering of the light guided in the substrate by the $TiO_2$ particles embedded in the glue.

The described embodiments comprise as an example an organic electroluminescent layer 50 within the layer stack. In alternative embodiments within the scope of this invention, the electroluminescent layer stack may comprise layer additional to the organic electroluminescent layer 50 such as hole transport layers, hole blocking layers, electron transport layers, electron blocking layers, charge injection layers further conducting layers etc.

LIST OF NUMERALS

| | |
|---|---|
| 10 | electroluminescent device |
| 20 | substrate electrode |
| 30 | counter electrode |
| 31 | counter electrode segments |
| 40 | substrate |
| 50 | organic electroluminescent layer |
| 60 | contact means |
| 70 | protective means |
| 80, 80' | divide |
| 90 | encapsulation means |
| 92 | a gas tight feed through |
| 93, 93' | connection means |
| 94 | insulating rim |
| 95 | top of encapsulation means |
| 96 | side of encapsulation means |
| 97 | insulating means for gas tight feed through 92 |
| 100 | contact area |
| 101 | insulating border for contact area 100 |
| 110, 110', 110" | counter-electrode-segments |
| 170 | getter |
| 180 | scattering means |
| 190 | divide width |
| 195 | protective width |
| 200 | substrate layer |
| 210 | substrate electrode layer |
| 220 | deposition of material |
| 230 | separator |
| 240 | shadowing edge |
| 250 | shielded area |
| 260 | deposited layer |

The invention claimed is:

1. An electroluminescent device, comprising:
a substrate and on top of the substrate a substrate electrode, a counter electrode and an electroluminescent layer stack with at least one organic electroluminescent layer arranged between the substrate electrode and the counter electrode, and an encapsulation means at least encapsutlting the electroluminescent layer stack, at least one divide dividing at least the counter electrode into a plurality of electrically separated counter-electrode-segments, and below the divide an electrically non-conductive protective means arranged on the substrate electrode, wherein said protective means has a sloping shape on a top surface of said protective means suitable to prevent the emergence of a shadowing edge and wherein said non-conductive protective means has viscosity properties that induce a flow of material of said non-conductive protective means that forms said sloping shape at a given temperature.

2. Electroluminescent device according to claim 1, wherein the protective means comprises non-conductive glue and/or a photoresist and/or a lacquer and/or paint and/or layer of glass, made of re-melted glass frit.

3. Electroluminescent device according to claim 1, wherein the electroluminescent device comprises at least one contact means, for electrically contacting at least one counter-electrode-segment of the counter electrode to an electrical source.

4. Electroluminescent device according to claim 3, wherein the contact means comprises conductive glue and/or a conductive lacquer and/or conductive paint.

5. Electroluminescent device according to claim 3, wherein the contact means is arranged fully above the protective means.

6. Electroluminescent device according to claim 5, wherein the contact means comprises conductive glue and/or a mechanical contact element, establishing a mechanical contact to at least one counter-electrode-segment.

7. Electroluminescent device according to claim 1, wherein the encapsulation means is electrically connected to the contact means.

8. Electroluminescent device according to claim 1, wherein the viscosity of said non-conductive protective means is lowered in response to heating of the non-conductive protective means.

9. Method for segmentation of a counter electrode of an electroluminescent device into a plurality of electrically separated counter-electrode-segments, said device comprising a substrate and on top of the substrate a substrate electrode, a counter electrode and an electroluminescent layer stack with at least one organic electroluminescent layer arranged between the substrate electrode and the counter electrode, and wherein an encapsulation means at least encapsulates the electroluminescent layer stack, the method comprising the steps of:
applying at least one protective means to the substrate electrode, wherein the protective means is electrically non-conductive and wherein material of said protective means forms a sloping shape that prevents an emergence of a shadowing edge due to viscosity properties of said material;
heating said protective means to lower the viscosity of the material such that the material is solidified with said sloping shape;
depositing the electroluminescent layer stack of at least one contiguous layer on top of the substrate electrode and the applied protective means;
depositing one contiguous counter electrode on top of the electroluminescent layer stack; and
inserting at least one divide into the contiguous counter electrode above a path of the protective means, to segment the counter electrode into the plurality of electrically separated counter-electrode-segments.

10. Method according to claim 9, wherein the divide is inserted into the counter electrode with a mechanical tool.

11. Method according to claim 9, wherein the counter-electrode-segments are connected to the encapsulation means by applying a contact means on top of each of the electrically separated counter electrode segments.

12. Method according to claim 11, wherein the step of applying the contact means is performed above the protective means, wherein the protective means exceed the contact means in width.

* * * * *